United States Patent
Takayanagi et al.

(10) Patent No.: US 10,382,708 B2
(45) Date of Patent: Aug. 13, 2019

(54) SOLID-STATE IMAGING DEVICE, METHOD FOR DRIVING SOLID-STATE IMAGING DEVICE, AND ELECTRONIC APPARATUS WITH PHYSICALLY UNCLONABLE FUNCTION

(71) Applicants: Brillnics Inc., Grand Cayman (KY); The Ritsumeikan Trust, Kyoto-shi, Kyoto (JP)

(72) Inventors: Isao Takayanagi, Tokyo (JP); Shunsuke Tanaka, Tokyo (JP); Shinichiro Matsuo, Tokyo (JP); Shunsuke Okura, Tokyo (JP); Shusuke Iwata, Tokyo (JP); Takeshi Fujino, Kusatsu (JP); Mitsuru Shiozaki, Kusatsu (JP); Takeshi Kumaki, Kusatsu (JP); Takaya Kubota, Kusatsu (JP); Masayoshi Shirahata, Kusatsu (JP)

(73) Assignees: BRILLNICS INC., Grand Cayman (KY); THE RITSUMEIKAN TRUST, Kyoto-shi (JP)

( * ) Notice: Subject to any disclaimer, the term of this patent is extended or adjusted under 35 U.S.C. 154(b) by 0 days.

(21) Appl. No.: 15/566,001

(22) PCT Filed: Mar. 18, 2016

(86) PCT No.: PCT/JP2016/058677
§ 371 (c)(1),
(2) Date: Oct. 12, 2017

(87) PCT Pub. No.: WO2016/167076
PCT Pub. Date: Oct. 20, 2016

(65) Prior Publication Data
US 2018/0115723 A1    Apr. 26, 2018

(30) Foreign Application Priority Data

Apr. 16, 2015 (JP) .................................. 2015-084309

(51) Int. Cl.
*H04N 5/347* (2011.01)
*H04N 5/378* (2011.01)
(Continued)

(52) U.S. Cl.
CPC ....... *H04N 5/347* (2013.01); *H01L 27/14609* (2013.01); *H01L 27/14625* (2013.01);
(Continued)

(58) Field of Classification Search
CPC ........ H04N 5/347; H04N 5/378; H04N 5/374; H04N 5/225; H04N 5/367; H01L 27/14625; H01L 27/14609
See application file for complete search history.

(56) References Cited

U.S. PATENT DOCUMENTS 6,826,291 B2 * 11/2004 Yoshiura ............... G06T 1/0028
                                                         375/E7.026
2006/0233357 A1    10/2006 Sato
(Continued)

FOREIGN PATENT DOCUMENTS

JP    2004-191480 A    7/2004
JP    2005-244356 A    9/2005
(Continued)

OTHER PUBLICATIONS

International Search Report dated Jun. 7, 2016, issued in counterpart application No. PCT/JP2016/058677. (2 pages).

*Primary Examiner* — Padma Haliyur
(74) *Attorney, Agent, or Firm* — Westerman, Hattori, Daniels & Adrian, LLP

(57) ABSTRACT

A solid-state imaging device 10 includes a pixel portion 20 in which a plurality of pixels including photodiodes are
(Continued)

arranged in rows and columns, a reading part 90 for reading pixel signals from the pixel portion, and a key generation part 82 which generates a unique key by using at least one of pixel fluctuation information or reading part fluctuation information. According to this configuration, the tamper resistance of the unique key can be secured and consequently alteration and falsification of images can be prevented.

37 Claims, 25 Drawing Sheets

(51) Int. Cl.
*H04N 5/225* (2006.01)
*H01L 27/146* (2006.01)
*H04N 5/374* (2011.01)
*H04N 5/367* (2011.01)

(52) U.S. Cl.
CPC ............. *H04N 5/225* (2013.01); *H04N 5/374* (2013.01); *H04N 5/378* (2013.01); *H04N 5/367* (2013.01)

(56) References Cited

U.S. PATENT DOCUMENTS

| | | |
|---|---|---|
| 2006/0268137 A1 | 11/2006 | Myers |
| 2012/0033807 A1 | 2/2012 | Asim et al. |
| 2014/0133652 A1 | 5/2014 | Oshida et al. |

FOREIGN PATENT DOCUMENTS

| | | |
|---|---|---|
| JP | 2006-340358 A | 12/2006 |
| JP | 2012-523734 A | 10/2012 |
| JP | 2014-96771 A | 5/2014 |

\* cited by examiner

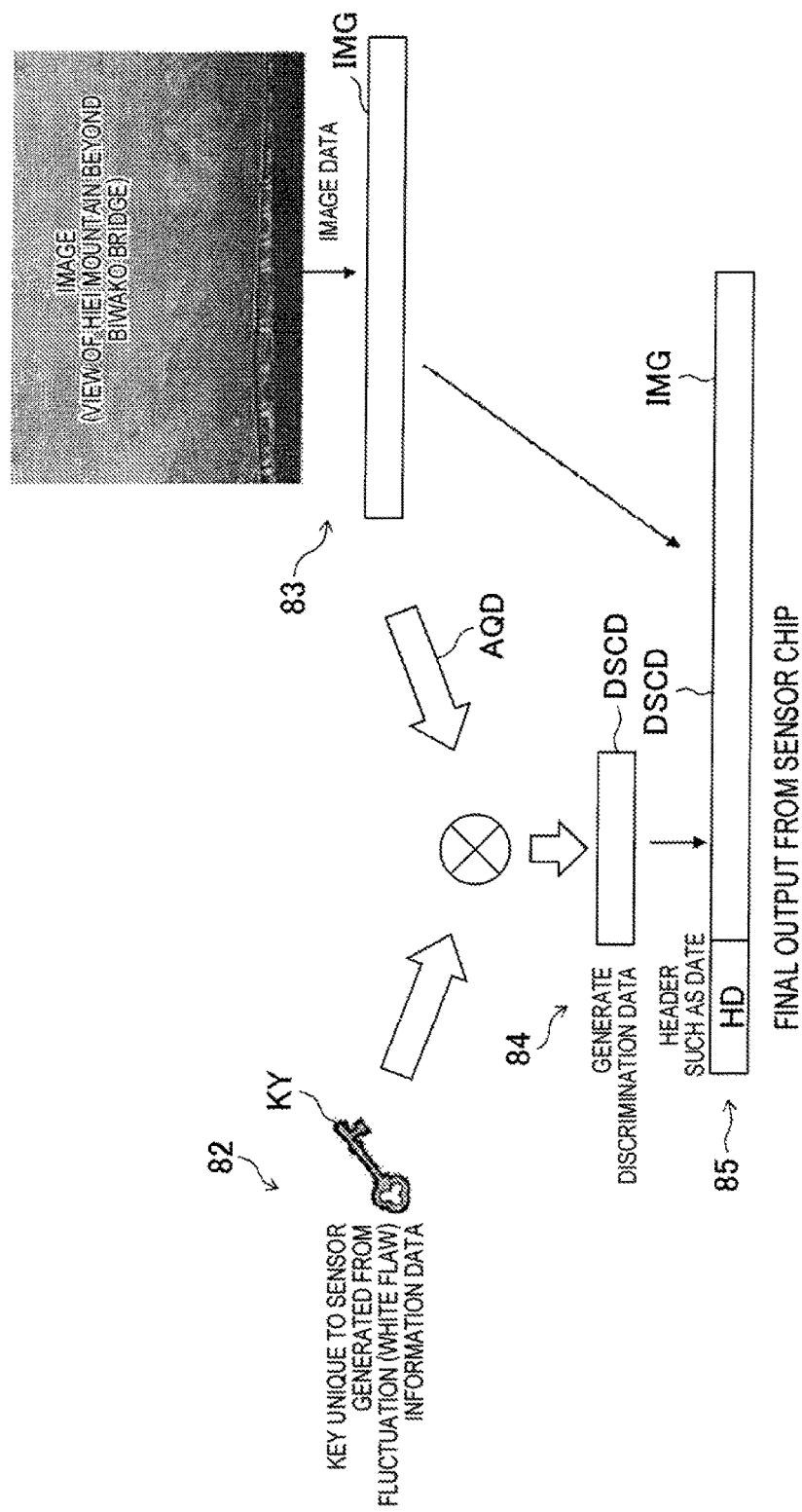

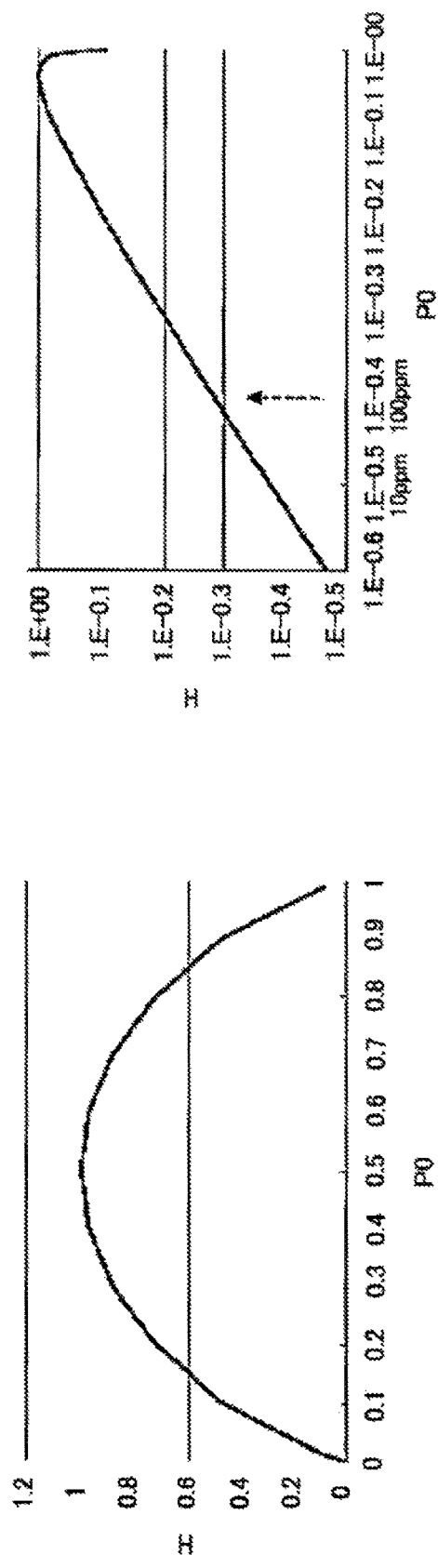

FIG. 8A

| | | |
|---|---|---|
| 0 | 0 | 0 |
| 0 | 0 | 0 |
| 0 | 0 | 0 |

000000000

⋮

| | | |
|---|---|---|
| 0 | 0 | 1 |
| 0 | 1 | 0 |
| 1 | 0 | 1 |

001010101

⋮

| | | |
|---|---|---|
| 1 | 0 | 1 |
| 0 | 0 | 1 |
| 0 | 1 | 1 |

100001111

⋮

| | | |
|---|---|---|
| 1 | 1 | 1 |
| 1 | 1 | 1 |
| 1 | 1 | 1 |

| | | |
|---|---|---|
| 0 | 0 | 0 |
| 0 | 0 | 0 |
| 0 | 0 | 0 |

000000000 → 0000

⋮

| | | |
|---|---|---|
| 0 | 0 | 1 |
| 0 | 1 | 0 |
| 1 | 0 | 1 |

001010101 → 0101

⋮

| | | |
|---|---|---|
| 1 | 0 | 1 |
| 0 | 0 | 1 |
| 0 | 1 | 1 |

100001111 → 1011

⋮

| | | |
|---|---|---|
| 1 | 1 | 1 |
| 1 | 1 | 1 |
| 1 | 1 | 1 |

111111111 → 1111

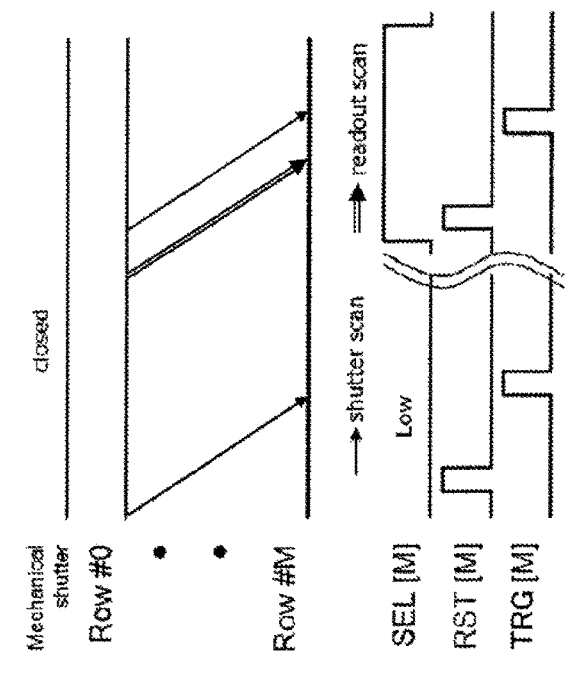
FIG. 10A
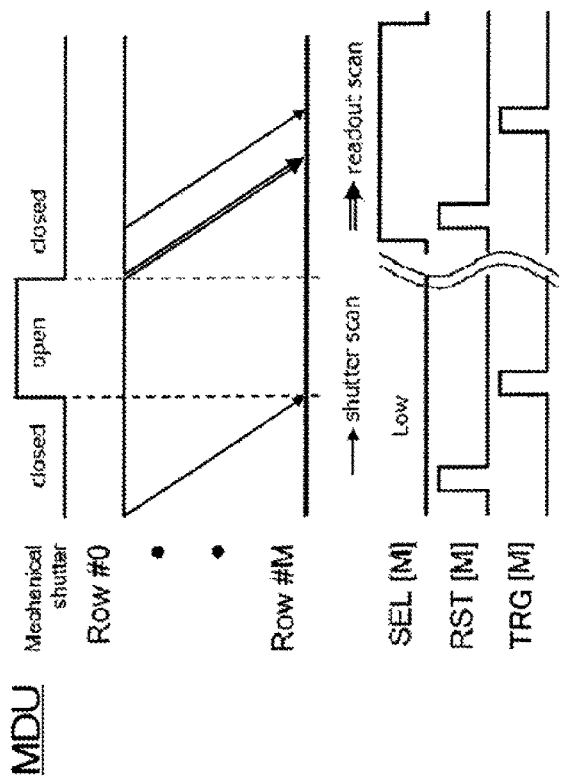
FIG. 10B
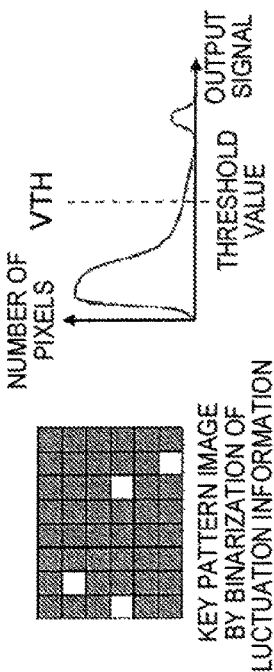
FIG. 10C
FIG. 10D

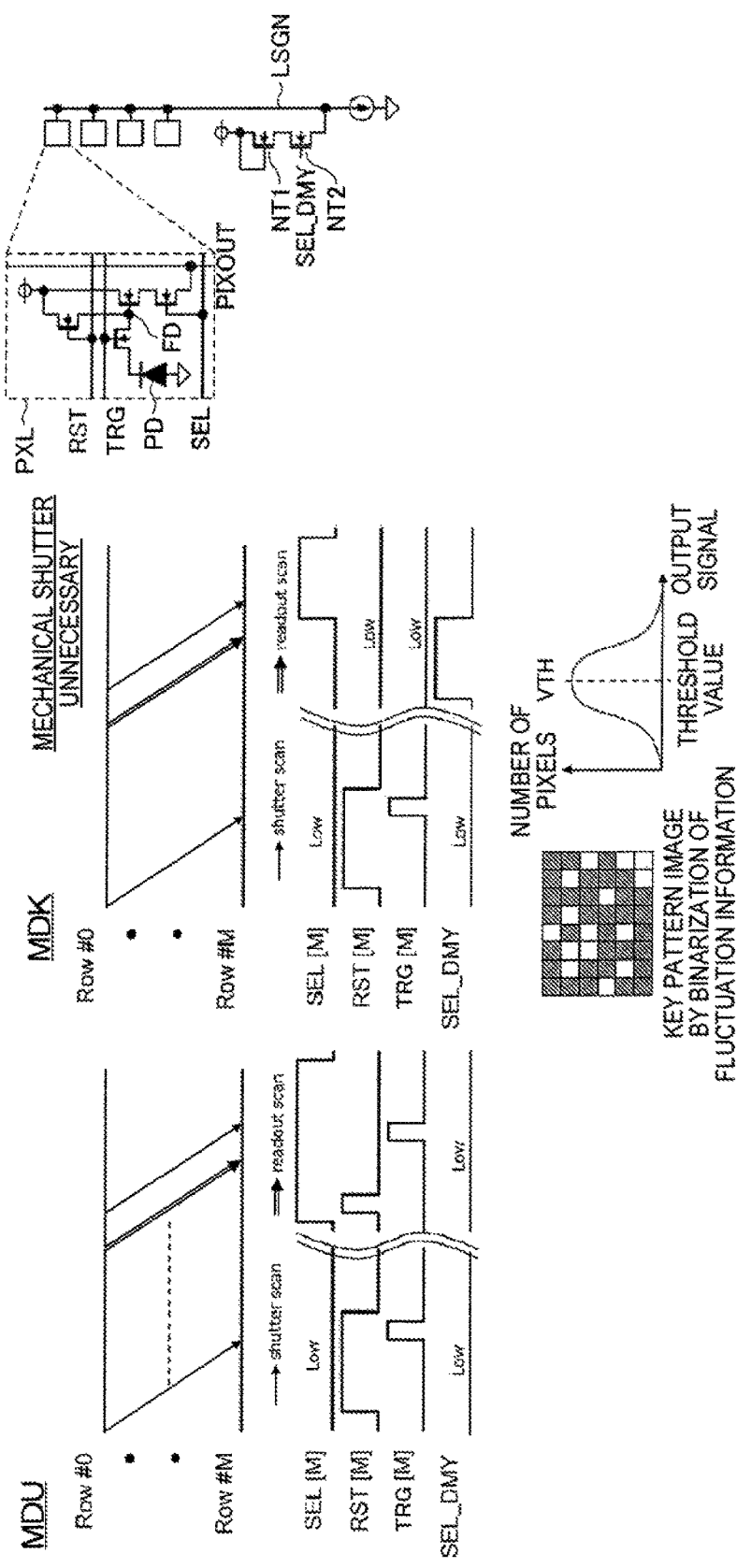

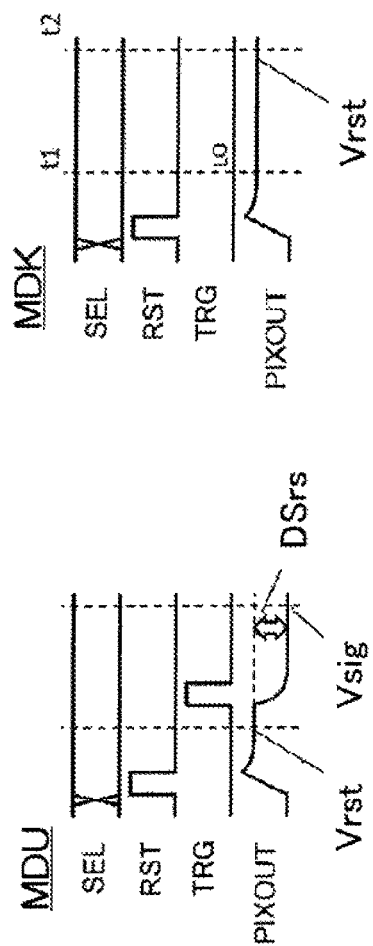
FIG. 13C
FIG. 13B
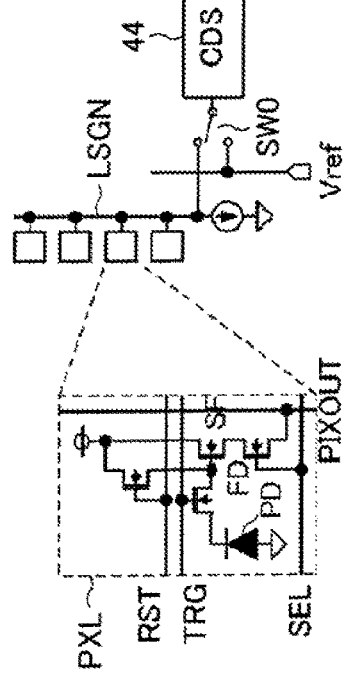
FIG. 13A
FIG. 13D  FIG. 13E
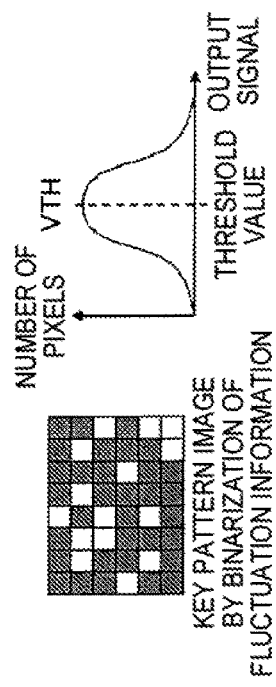

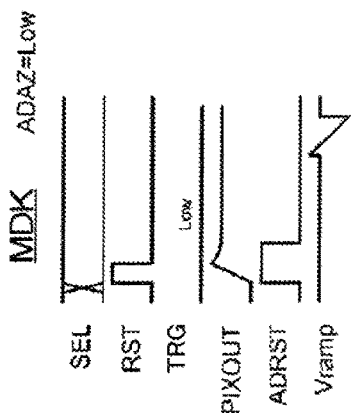
FIG. 16B  FIG. 16C
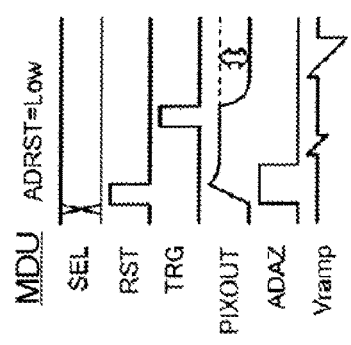
FIG. 16A
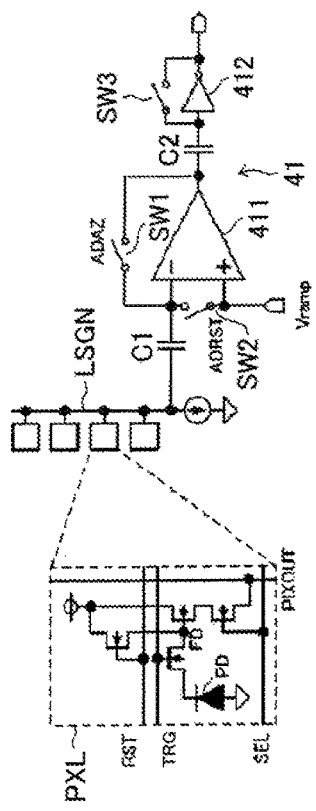
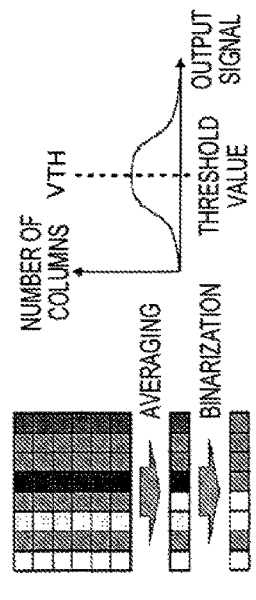
FIG. 16D  FIG. 16E

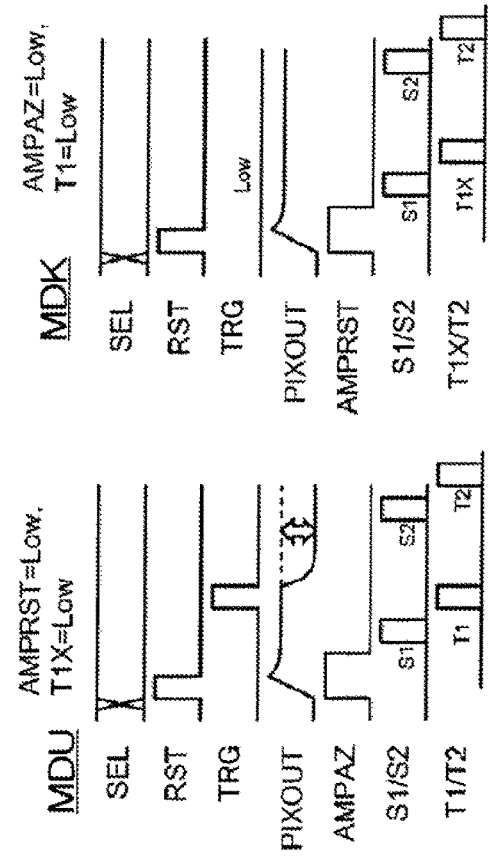
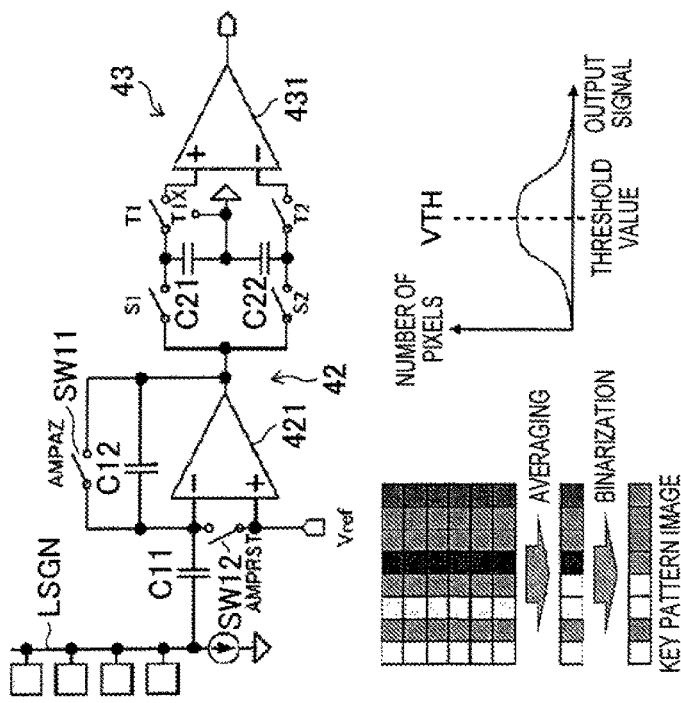
FIG. 17A  FIG. 17B  FIG. 17C  FIG. 17D  FIG. 17E

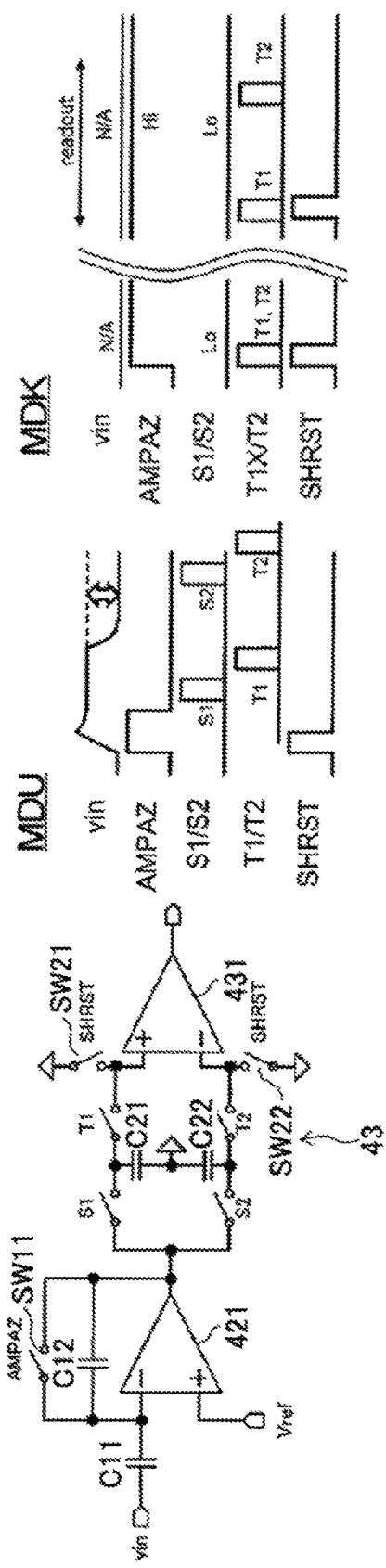
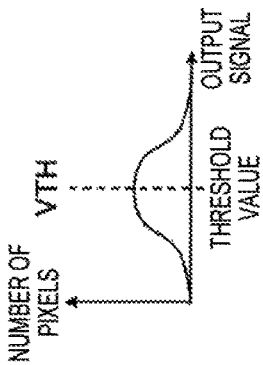
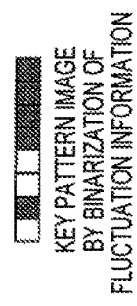
FIG. 18A   FIG. 18B   FIG. 18C
FIG. 18D
FIG. 18E

WITH CDS

WITHOUT CDS

0/1 JUDGMENT
EXCLUDE CENTER
OF HISTOGRAM AS "z"
FROM KEY PATTERN

EXCLUDE AMOUNT OF WIDTH CONSIDERING CHANGE
IN ENVIRONMENT FLUCTUATION FROM JUDGMENT

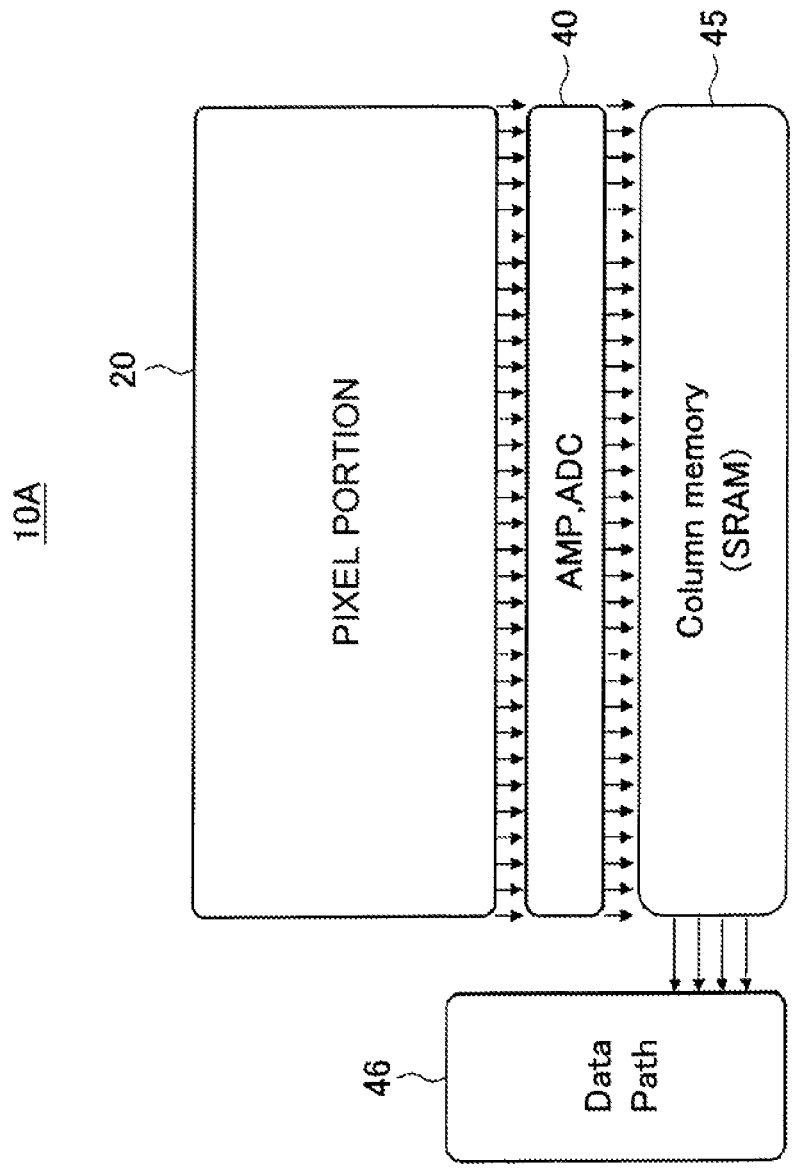

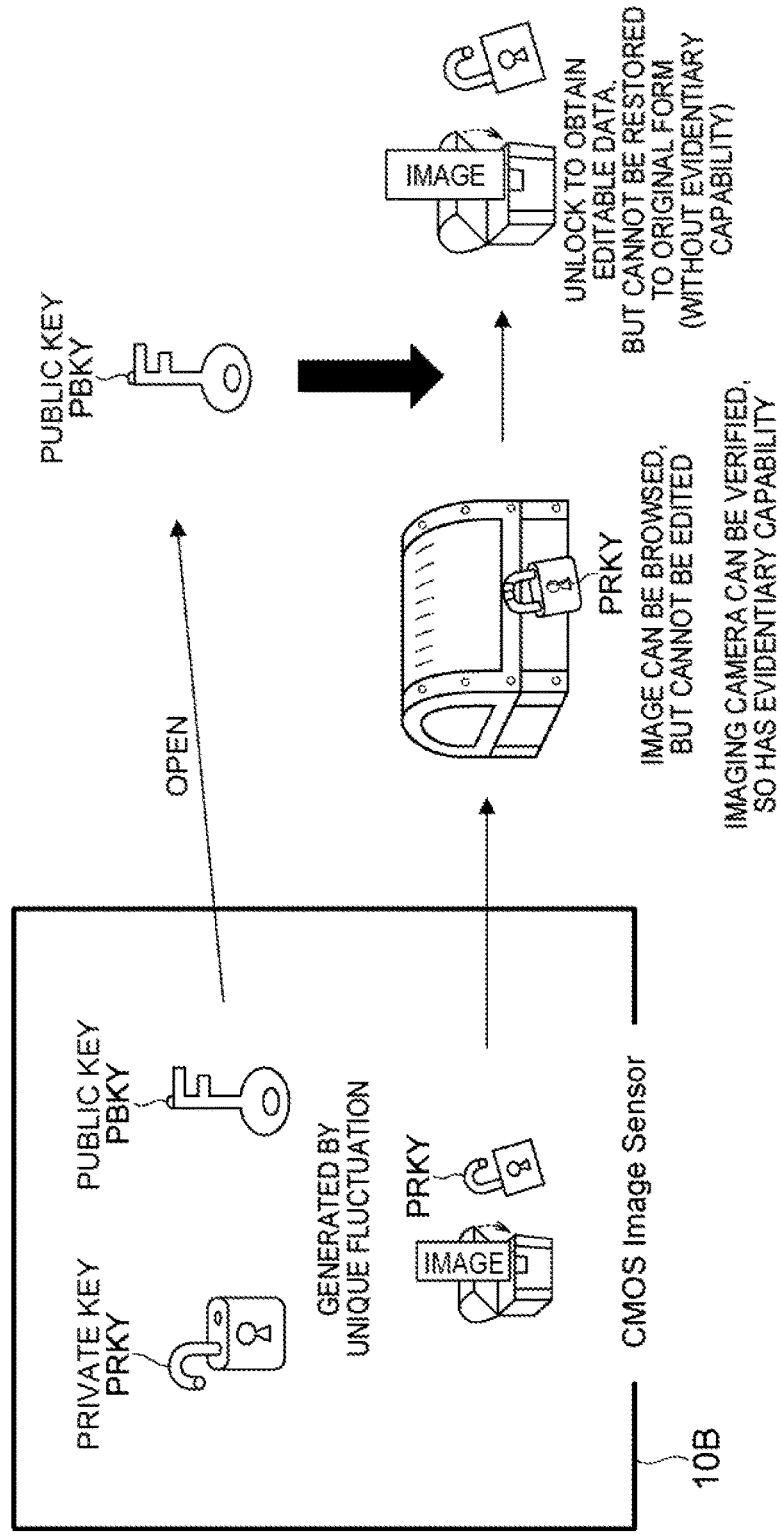

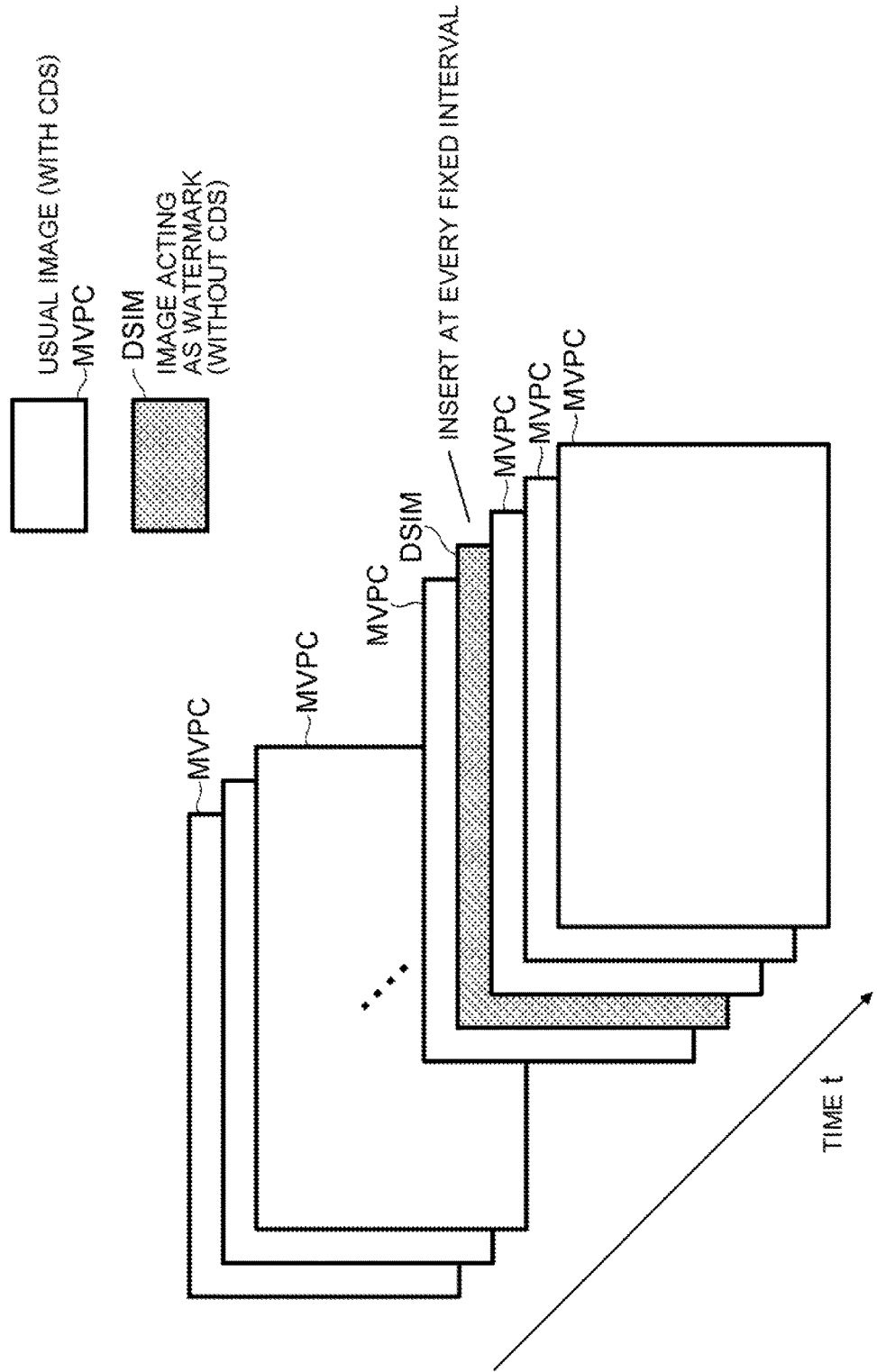

SOLID-STATE IMAGING DEVICE, METHOD FOR DRIVING SOLID-STATE IMAGING DEVICE, AND ELECTRONIC APPARATUS WITH PHYSICALLY UNCLONABLE FUNCTION

TECHNICAL FIELD

The present invention relates to a solid-state imaging device, a method for driving the solid-state imaging device, and an electronic apparatus.

BACKGROUND ART

As solid-state imaging devices (image sensors) using photoelectric conversion elements which detect light to generate electric charges, CMOS (complementary metal oxide semiconductor) image sensors have been put into practical use. CMOS image sensors are being widely applied as parts of digital cameras, video cameras, monitoring cameras, medical endoscopes, personal computers (PC), mobile phones, and other portable terminal devices (mobile devices) and various other types of electronic apparatuses.

A CMOS image sensor has a floating diffusion (FD) amplifier having, for each pixel, a photodiode (photoelectric conversion element) and floating diffusion layer. For readout, the mainstream type is the column parallel output type that performs selects a certain row in a pixel array and simultaneously reads the pixels out to a column output direction.

Each of the pixels in a CMOS image sensor basically includes, for example, one photodiode and, with respect to that, four elements of a transfer gate comprised of a transfer transistor, a reset gate comprised of a reset transistor, a source follower gate (amplification gate) comprised of a source follower transistor, and a selection gate comprised of a selection transistor as active elements. Further, each pixel may be provided with an overflow gate (overflow transistor) for discharging an overflow charge overflowing from the photodiode in an accumulation (storage) period of the photodiode.

The transfer transistor is held in a non-conductive state in the charge accumulation period of the photodiode and is held in a conductive state by application of a driving signal to the gate in a transfer period transferring the accumulated (stored) charge in the photodiode to the floating diffusion FD and transfers the charge which is photoelectrically converted in the photodiode to the floating diffusion FD.

The reset transistor resets the potential of the floating diffusion FD to the potential of a power supply line by a reset signal being given to its gate.

The floating diffusion FD is connected to the gate of the source follower transistor. The source follower transistor is connected through the selection transistor to a vertical signal line and configures a source follower together with a constant current source of a load circuit outside of the pixel portion. Further, a control signal (address signal or select signal) is given to the gate of the selection transistor whereby the selection transistor turns ON. If the selection transistor becomes ON, the source follower transistor amplifies the potential of the floating diffusion FD and outputs a voltage in accordance with that potential to the vertical signal line. Through the vertical signal line, voltages output from the pixels are output to a pixel signal readout circuit comprised of a column parallel processing part. In the column-parallel processing, the image data is for example converted from an analog signal to a digital signal and is transferred to a later stage signal processing part where it is subjected to predetermined image signal processing whereby a desired image is obtained.

SUMMARY OF INVENTION

Technical Problem

In this regard, in the solid-state imaging device (image sensor) explained above, basically owners of various types of electronic apparatuses and users permitted to use the same can easily reproduce the captured image data to view those images. However, in current solid-state imaging devices, the image data can be easily reproduced even in a case where the captured image data is data concerned with personal secrets, therefore there is the disadvantage that unauthorized use, alteration, falsification, etc. of the images are easily carried out. It is possible to ensure more solid confidentiality by encryption using a unique key. However, in actual circumstances, it is difficult to ensure tamper resistance (difficulty of analysis) of a unique key.

The present invention provides a solid-state imaging device, a method for driving the solid-state imaging device, and an electronic apparatus capable of ensuring tamper resistance of a unique key and consequently capable of preventing alteration and falsification of images.

Solution to Problem

A solid-state imaging device of a first aspect of the present invention has a pixel portion in which a plurality of pixels including photodiodes are arranged in rows and columns, a reading part for reading pixel signals from the pixel portion, and a key generation part which generates a unique key by using at least one of pixel fluctuation information or reading part fluctuation information.

A second aspect of the present invention is a method for driving a solid-state imaging device including a pixel portion in which a plurality of pixels including photodiodes are arranged in rows and columns and a reading part for reading pixel signals from the pixel portion, comprising an information acquisition step of acquiring at least one information of pixel fluctuation information or reading part fluctuation information and a key generation step of generating a unique key by using the fluctuation information acquired in the information acquisition step.

An electronic apparatus of a third aspect of the present invention has a solid-state imaging device and an optical system of forming a subject image in the solid-state imaging device, wherein the solid-state imaging device includes a pixel portion in which a plurality of pixels including photodiodes are arranged in rows and columns, a reading part for reading pixel signals from the pixel portion, and a key generation part for generating a unique key by using at least one of pixel fluctuation information or reading part fluctuation information.

Advantageous Effects of Invention

According to the present invention, the tamper resistance of the unique key can be secured and consequently alteration and falsification of images can be prevented.

BRIEF DESCRIPTION OF DRAWINGS

FIG. 5 is a view schematically showing processing in the encryption processing system in FIG. 4.

FIGS. 7A and 7B are diagrams showing an example of an amount of information per pixel.

FIGS. 8A and 8B are diagrams for explaining output and the amount of information in a case of nine elements.

FIGS. 10A to 10D are diagrams showing operation waveforms etc. in a usual operation mode and key creation mode in a case where a leak current of a photodiode is employed as the leak current of a pixel.

FIGS. 12A to 12E are diagrams showing operation waveforms etc. in the principal parts in the usual operation mode and key creation mode in a case where a leak current of a floating diffusion is employed as the leak current of a pixel.

FIGS. 13A to 13E are diagrams showing operation waveforms etc. in the principal parts in the usual operation mode and key creation mode in a case where fluctuation information of threshold values of source follower transistors is employed as the fluctuation information of pixels.

FIGS. 16A to 16E are diagrams showing operation waveforms etc. in the principal parts in the usual operation mode and key creation mode in a case where fluctuation information of ADCs is employed as the fluctuation information of the readout circuit.

FIGS. 17A to 17E are diagrams showing operation waveforms etc. in the principal parts in the usual operation mode and key creation mode in a case where fluctuation information of amplifiers is employed as the fluctuation information of the readout circuit.

FIGS. 18A to 18E are diagrams showing operation waveforms etc. in the principal parts in the usual operation mode and key creation mode in a case where fluctuation information of S/H circuits is employed as the fluctuation information of the readout circuit.

FIG. 20 is a block diagram schematically showing a solid-state imaging device having a column memory.

FIG. 21 is a diagram for explaining output information of an SRAM when the power is ON.

FIG. 23 is a diagram for explaining a modification of the encryption processing system in the solid-state imaging device according to an embodiment of the present invention.

FIG. 24 is a diagram for explaining another modification of the encryption processing system in the solid-state imaging device according to an embodiment of the present invention.

REFERENCE SIGNS LIST

10 . . . solid-state imaging device, 20 . . . pixel portion, 30 . . . vertical scanning circuit, 40 . . . readout circuit, 50 . . . horizontal scanning circuit, 60 . . . timing control circuit, 70 . . . signal processing circuit, 80 . . . encryption processing system, 81 . . . information acquisition part, 82 . . . key generation part, 83 . . . image data generation part, 84 . . . discrimination data generation part, 85 . . . combining portion, 86 . . . memory, 90 . . . reading part, 100 . . . electronic apparatus, 110 . . . CMOS image sensor (IMG-SNS), 120 . . . optical system, and 130 . . . signal processing circuit (PRC).

Description of Embodiments

Below, embodiments of the present invention will be explained with reference to the drawings.

Figure 1:
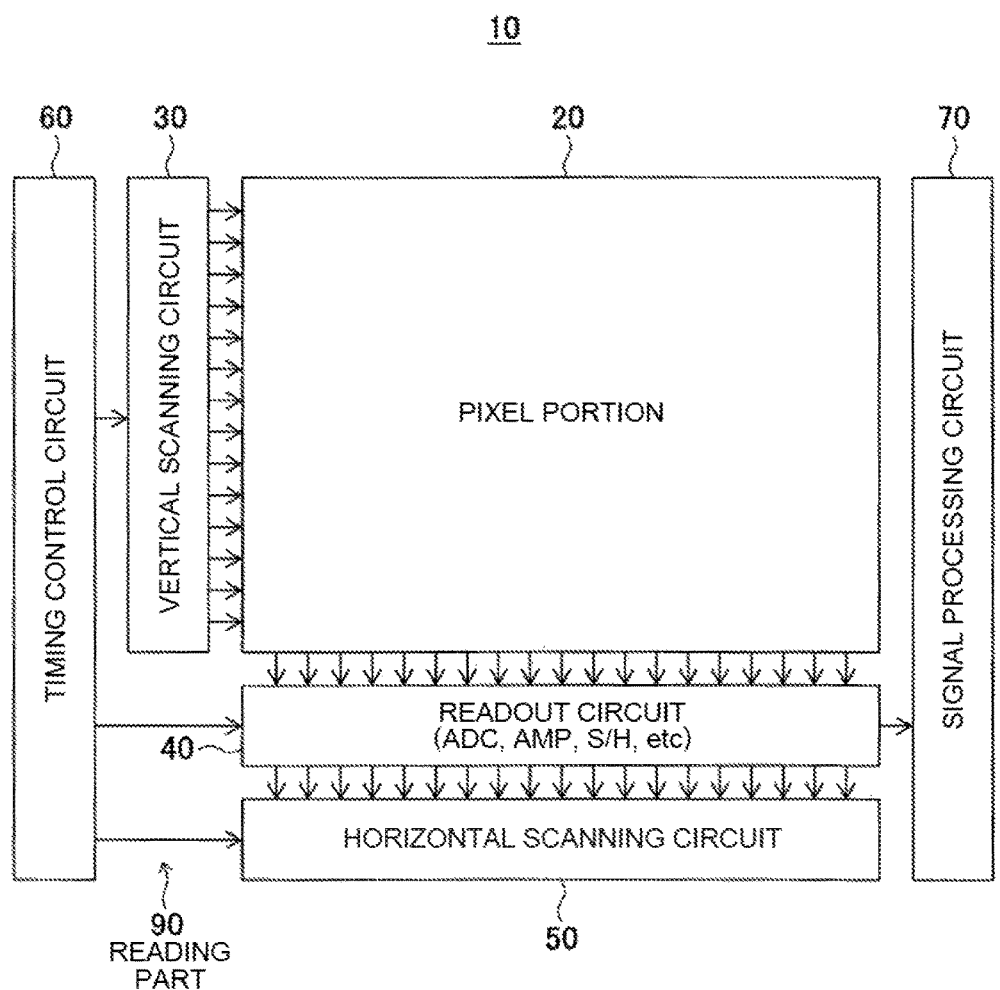
FIG. 1 is a block diagram showing an example of the configuration of a solid-state imaging device according to an embodiment of the present invention.

FIG. 1 is a block diagram showing an example of the configuration of a solid-state imaging device according to an embodiment of the present invention. In the present embodiment, a solid-state imaging device 10 is for example configured by a CMOS image sensor.

This solid-state imaging device 10, as shown in FIG. 1, has an imaging section comprised of a pixel portion 20, vertical scanning circuit (row scanning circuit) 30, readout circuit (column readout circuit) 40, horizontal scanning circuit (column scanning circuit) 50, timing control circuit 60, and signal processing circuit 70 as principal components. Among these components, for example, the vertical scanning circuit 30, readout circuit 40, and timing control circuit 60 configure the reading part 90 of pixel signals.

In the present embodiment, the solid-state imaging device 10 is configured so that it can operate in a usual operation mode MDU and a key creation mode MDK.

In the pixel portion 20, a plurality of pixels each including a photodiode (photoelectric conversion element) and intra-pixel amplifier are arranged in a two-dimensional matrix state comprised of "n" number of rows and "m" number of columns.

Figure 2:
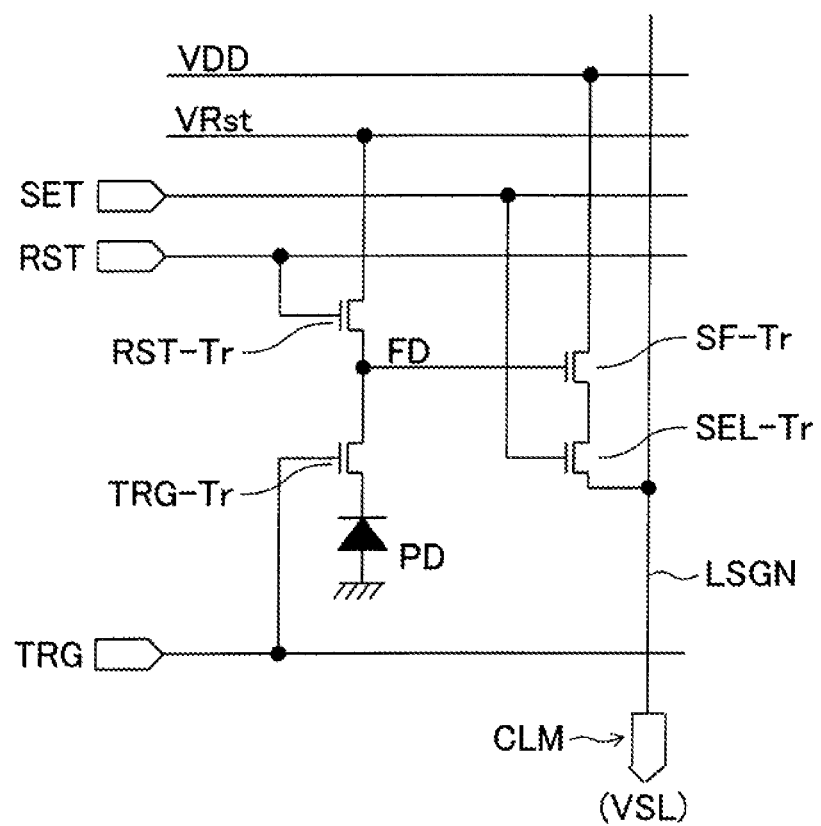
FIG. 2 is a circuit diagram showing an example of a pixel according to the present embodiment.

FIG. 2 is a circuit diagram showing an example of a pixel according to the present embodiment.

This pixel PXL for example has a photoelectric conversion element comprised of a photodiode (PD). Further, for this photodiode PD, it has one each of a transfer transistor TRG-Tr, reset transistor RST-Tr, source follower transistor SF-Tr, and selection transistor SEL-Tr.

The photodiode PD generates and accumulates a signal charge (here, electrons) in an amount in accordance with a quantity of incident light. Below, the case where the signal charge is comprised of electrons and each transistor is an n-type transistor will be explained, but the signal charge may also be comprised of holes and each transistor may also be a p-type transistor. Further, the present embodiment is effective even in a case where each transistor is shared among a plurality of photodiodes and even in a case where a three-transistor (3Tr) pixel not having a selection transistor is employed.

The transfer transistor TRG-Tr is connected between the photodiode PD and the floating diffusion FD (floating diffusion layer) and is controlled through a control line TRG. The transfer transistor TRG-Tr is selected and becomes the conductive state in the period when the control line TRG is a high level (H) and transfers electrons which are photoelectrically converted in the photodiode PD to the floating diffusion FD.

The reset transistor RST-Tr is connected between a power supply line VRst and the floating diffusion FD and is controlled through a control line RST. Note that, the reset transistor RST-Tr may also be configured so that it is connected between a power supply line VDD and the floating diffusion FD and is controlled through the control line RST. The reset transistor RST-Tr is selected and becomes the conductive state in the period when the control line RST is the H level and resets the floating diffusion FD to the potential of the power supply line VRst (or VDD).

The source follower transistor SF-Tr and the selection transistor SEL-Tr are connected in series between the power supply line VDD and a vertical signal line LSGN. The gate of the source follower transistor SF-Tr is connected to the floating diffusion FD. The selection transistor SEL-Tr is controlled through a control line SEL. The selection transistor SEL-Tr is selected and becomes the conductive state in the period when the control line SEL is H. Due to this, the source follower transistor SF-Tr outputs a column output analog signal VSL in accordance with the potential of the floating diffusion FD to the vertical signal line LSGN. These operations are for example carried out simultaneously in parallel for each row's worth of pixels since the gates of the transfer transistors TRG-Tr, reset transistors RST-Tr, and selection transistors SEL-Tr are connected in unit of rows.

In the pixel portion 20, the pixels PXL are arranged in "n" number of rows and "m" number of columns, therefore there are "n" numbers of control lines SEL, RST, and TRG and "m" number of vertical signal lines LSGN. In FIG. 1, the control lines SEL, RST, and TRG are shown by single row scanning control lines.

The vertical scanning circuit 30 drives pixels through the row scanning control lines in a shutter row and readout row according to the control of the timing control circuit 60. Further, the vertical scanning circuit 30, according to address signals, outputs row selection signals of row addresses of the read row for reading of the signals and the shutter row for resetting the charges accumulated in the photodiodes PD.

The readout circuit 40 may also be configured so that it includes a plurality of column signal processing circuits (not shown) which are arranged corresponding to the column outputs of the pixel portion 20 and so that column-parallel processing is possible among the plurality of column signal processing circuits.

The readout circuit 40 can be configured to include a correlated double sampling (CDS) circuit and/or ADC (analog/digital converter: AD converter), amplifier (AMP), sample/hold (S/H) circuit, and so on.

Figure 3A:
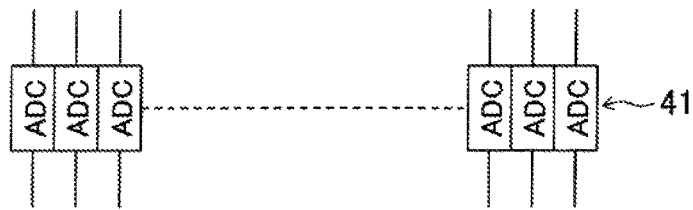
FIGS. 3A to 3C are diagrams for explaining an example of the configuration of a readout system of column output of a pixel portion in the solid-state imaging device according to an embodiment of the present invention.
Figure 3B:
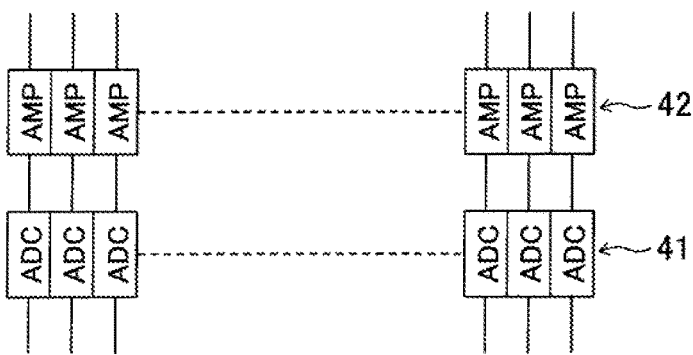
Figure 3C:
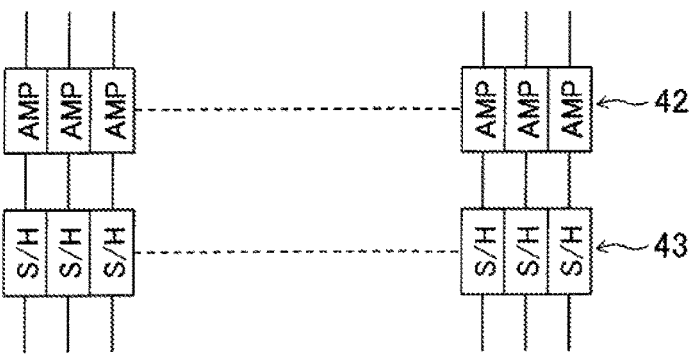

In this way, the readout circuit 40, for example, as shown in FIG. 3A, may be configured to include ADCs 41 for converting column output analog signals VSL of the pixel portion 20 to digital signals. Alternatively, the readout circuit 40, for example, as shown in FIG. 3B, may have amplifiers (AMP) 42 which amplify the column output analog signals VSL of the pixel portion 20 arranged at it. Further, the readout circuit 40, for example, as shown in FIG. 3C, may have sample/hold (S/H) circuits 43 which sample and hold the column output analog signals VSL of the pixel portion 20 arranged at it. Further, the readout circuit 40 may be have a SRAM arranged at it as the column memory for storing signals obtained by applying predetermined processing to the pixel signals output from the columns in the pixel portion 20.

The horizontal scanning circuit 50 scans the signals processed in the plurality of the ADCs and other column signal processing circuits in the readout circuit 40, transfers the results in the horizontal direction, and outputs the same to the signal processing circuit 70.

The timing control circuit 60 generates timing signals which are necessary for signal processing in the pixel portion 20, vertical scanning circuit 30, readout circuit 40, horizontal scanning circuit 50, etc.

The signal processing circuit 70 generates two-dimensional image data by predetermined signal processing with respect to the readout signals which are read out by the readout circuit 40 and are subjected to predetermined processing. Note, the signal processing circuit 70 in the present embodiment, in order to prevent unauthorized use and alteration, falsification, etc. of the images, is configured so that a unique key is generated from fluctuation information unique to the solid-state imaging device 10 (fluctuation information of pixels and readout circuit), the unique key and the acquisition data obtained from the solid-state imaging device 10 are combined to generate discrimination data, this discrimination data is combined with the image data and is output, and the discrimination data cannot be correctly prepared if information concerning the unique key is not known. Due to this, the solid-state imaging device 10 in the present embodiment can ensure tamper resistance (difficulty of analysis) of the unique key and consequently can prevent alteration and falsification of the images.

Below, the characterizing configuration and functions of the solid-state imaging device 10 in the present embodiment will be explained while focusing on so-called encryption processing for generation of the unique key and combination of the discrimination data containing the unique key with the image data.

Figure 4:
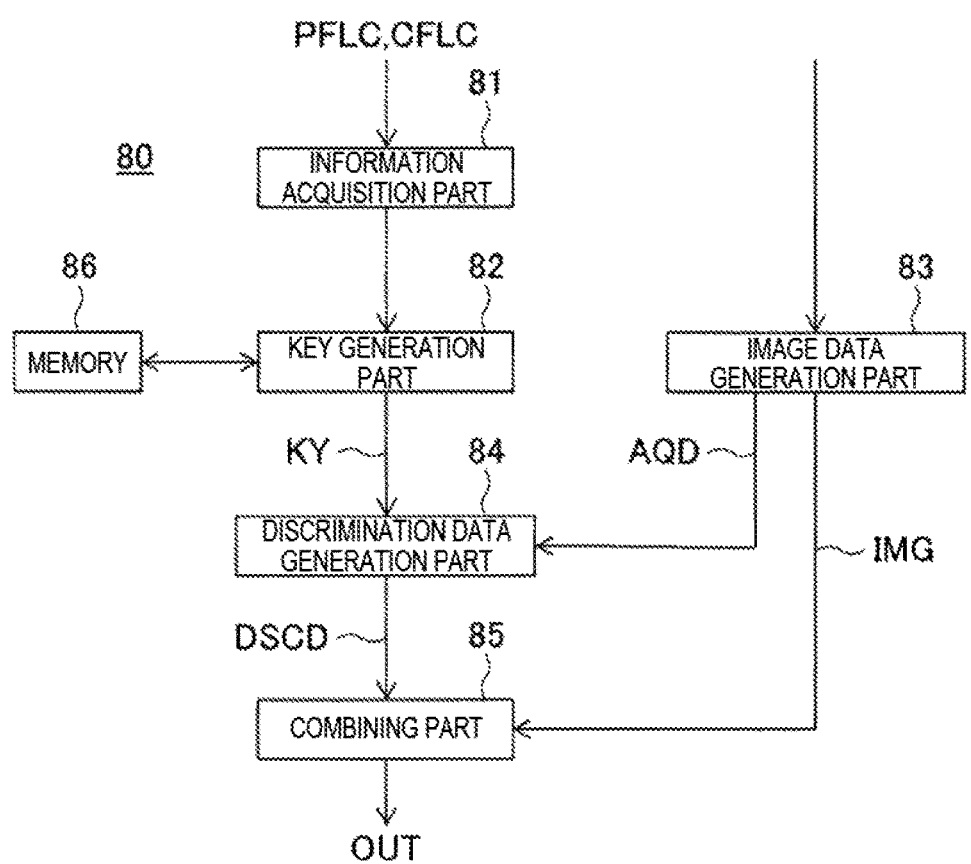
FIG. 4 is a block diagram showing an overall outline of an encryption processing system according to the present embodiment.

FIG. 4 is a block diagram showing an overall outline of the encryption processing system according to the present embodiment. FIG. 5 is a view schematically showing the processing in the encryption processing system in FIG. 4.

An encryption processing system 80 in FIG. 4, as principal components, has an information acquisition part 81, key generation part 82, image data generation part 83, discrimination data generation part 84, combining portion 85, and memory 86. Note that, in the example in FIG. 4, the information acquisition part 81 and the key generation part 82 are configured as separate functional blocks. However, it is also possible to configure the information acquisition part 81 and the key generation part 82 as a single functional block.

The information acquisition part 81 acquires at least one of fluctuation information PFLC of the pixels PXL or fluctuation information CFLC of the circuits configuring the readout circuit 40 and supplies the acquired fluctuation information to the key generation part 82.

Here, the fluctuation information PFLC of the pixels PXL and the fluctuation information CFLC of the circuits configuring the readout circuit 40 will be explained in brief. They will be explained in detail later by giving concrete examples.

Regarding Fluctuation Information PFLC of Pixels PXL

First, the fluctuation information PFLC of the pixels PXL will be explained. In the present embodiment, as the fluctuation information PFLC of the pixels PXL, basically use is made of the leak current and position information. Here, the reason why the leak current is employed will be explained.

Figure 6B:
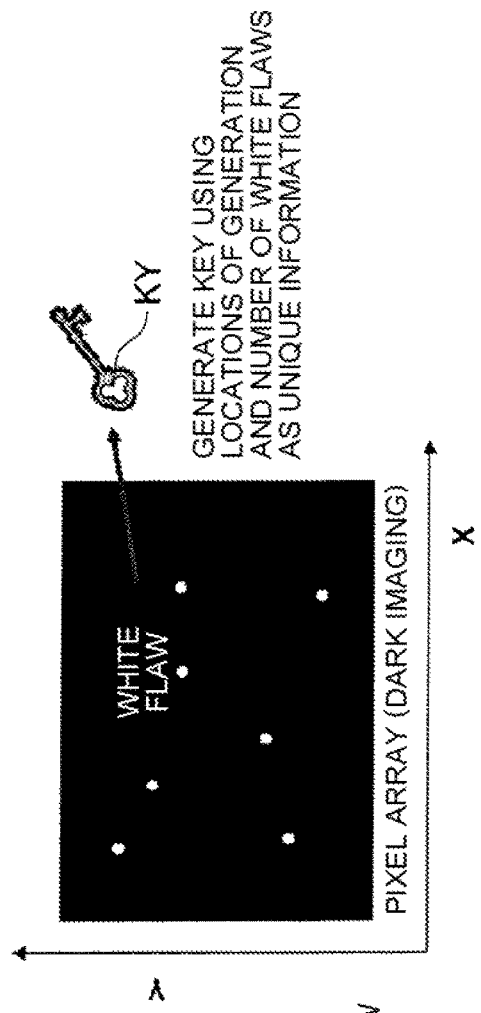
FIGS. 6A and 6B are diagrams for explaining a reason why a leak current is employed as fluctuation information of pixels.
Figure 6A:
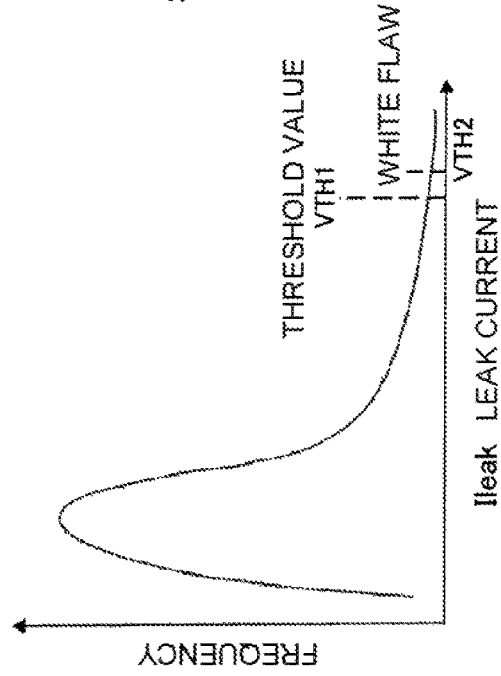

FIGS. 6A and 6B are diagrams for explaining the reason why leak current is employed as the fluctuation information of the pixels. FIG. 6A shows a distribution of intensities of the pixel leak current, and FIG. 6B shows an example of a distribution of locations of white flaws.

In the sensor pixels of the solid-state imaging device 10, as shown in FIGS. 6A and 6B, there is leak current which cannot be 100% suppressed. A particularly extreme leak current (instantaneously causing a white spot even in dark field exposure) will be referred to as a "white flaw" or "white point". Below, this will be referred to as a "white flaw". In the solid-state imaging device 10, effort is made to reduce such white flaws as much as possible before shipping. Further, for unsuppressed white flaws, a white flaw pixel is compensated for from the pixel data around this in latter image processing, then the resultant image is output. Where such a white flaw will appear in the pixel array cannot be determined unless actually creating the array. In addition, it has reproducibility. For this reason, this can be regarded as information unique to an individual array. Therefore, in the present embodiment, as the fluctuation information PFLC of the pixels PXL, use is made of the leak current and position information to generate the unique key KY. For example, as shown in FIGS. 6A and 6B, it is possible to generate the unique key KY by using the locations of occurrence (positions of occurrence) and number of white flaws as the unique information. In the present embodiment, this information is used as the unique key for encryption processing applying the PUF (physically unclonable function) technique used in the security field.

FIGS. 7A and 7B are graphs showing an example of the amount of information per pixel. The amount of information H per pixel is given by the following equation:

$$H = -P0 \cdot \log_2(P0) - P1 \cdot \log_2(P1)$$

where, P0: Probability of appearance of white flaw, P1: Probability 1 of nonappearance of white flaw−P0

For example, in a case of one million pixels (1E6), a white flaw 100 ppm corresponds to 100 flaws and the amount of information becomes as follows:

$$1.47E{-}3 \times 1E6 = 1.47E3 \text{ bits} = 1{,}470 \text{ bits}$$

Incidentally, as the factor necessary for key generation (from the security side), the white flaw probability per pixel is given as follows:

$$100 \text{ to } 3{,}000 \text{ ppm} = 0.01\% \text{ to } 0.3\%$$

Figure 9:
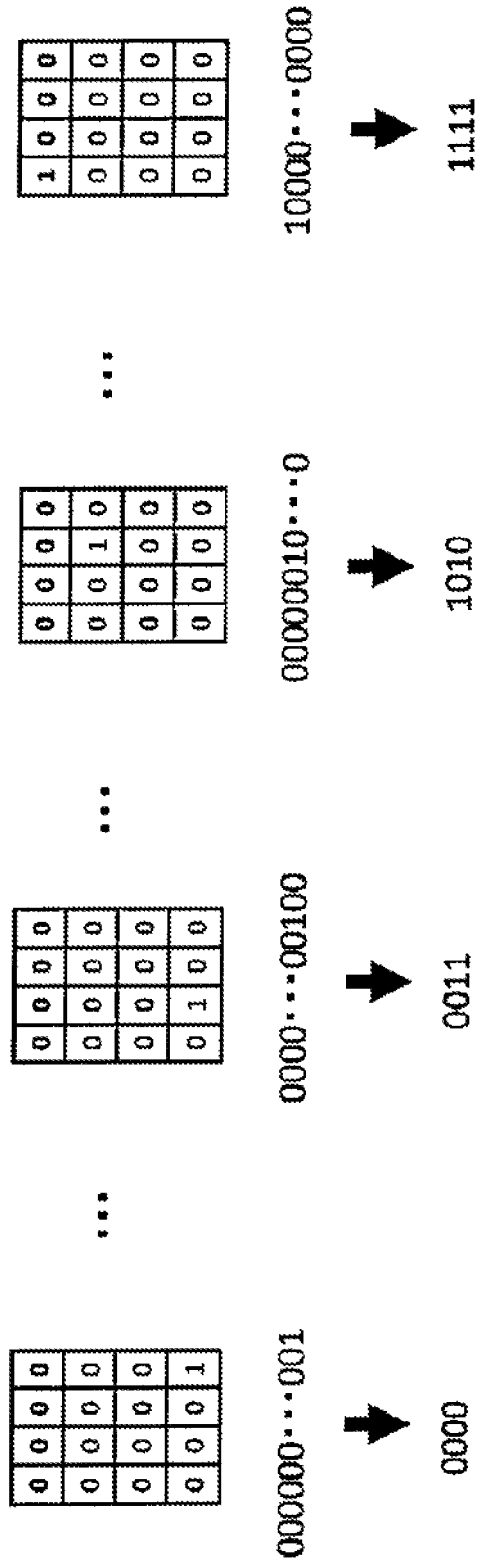
FIG. 9 is a diagram for explaining a biased output and amount of information in a case of 16 elements.

Next, the output and amount of information will be considered with reference to FIGS. 8A and 8B and FIG. 9. FIGS. 8A and 8B are diagrams for explaining the output and amount of information in the case of nine elements. FIG. 9 is a diagram for explaining the biased output and amount of information in a case of 16 elements.

In the case of nine (3×3) elements, as shown in FIG. 8A, if 1 or 0 appears with a probability of ½ in each element, this output can be used as the key as it is. It is effective as 9 bits' worth of key information. If 5 bits are necessary for error correction due to noise, as shown in FIG. 8B, the effective key information becomes 4 bits. This 4 bits' worth of information is output as the key.

Next, the case of 16 (4×4) elements and biased output will be explained. In the case of 16 (4×4) elements, as shown in FIG. 9, the probability of 1 appearing in any one element is 1/16. There are only a total of 16 sample groups in which 1 reliably appears in any one element, so there are only 4 bits of information. For information of white flaws present in 100 ppm in one million pixels, based on the same thinking as this, if probabilities of appearance of 1/0 are equal among the pixels, since there are one million bits, the amount of information becomes about 1,400 bits. If this amount of information, this can be effectively utilized as the key.

The information acquisition part 81 which acquires the pixel fluctuation information PFLC acquires the leak information of pixels linked with the threshold value VTH as shown in FIG. 6A. In the case of the example in FIGS. 6A and 6B, a leak current Ileak larger than the threshold value VTH1 can be judged as a white flaw. Further, the information acquisition part 81 may have a plurality of threshold values set therein (VTH1 and VTH2 in the example in FIGS. 6A and 6B). It is also possible to discriminate the information by the relationship with the plurality of threshold values VTH1 and VTH2. Note that, it is also possible to change the threshold value VTH in accordance with the temperature or other aspects of the environment.

Further, the information acquisition part 81 can employ as the pixel fluctuation information PFLC the position information of pixels exhibiting a certain level or more of a leak current. Further, the information acquisition part 81 can employ as the pixel fluctuation information PFLC the set of higher significant pixels in the order of leak current. Further, the information acquisition part 81 can employ as the pixel fluctuation information PFLC addresses in the column direction and row direction of the set.

Leak Current of Photodiode

The information acquisition part 81 can employ as the leak current Ileak of a pixel the leak current of the photodiode PD.

FIGS. 10A to 10D are diagrams showing operation waveforms etc. in the principal parts in the usual operation mode and key creation mode in a case where the leak current of a photodiode PD is employed as the leak current Ileak of a pixel. FIG. 10A shows operation waveforms at the time of the usual operation mode MDU, FIG. 10B shows operation waveforms of the key creation mode MDK, FIG. 10C shows a key pattern image obtained by binarization of the fluctuation information, and FIG. 10D shows relationships among the output signal, number of pixels, and threshold value VTH. Note that, as explained before, in the present embodiment, the solid-state imaging device 10 is configured so that it can operate in the usual operation mode MDU and key creation mode MDK.

In the usual operation mode MDU, as shown in FIG. 10A, the pixels PXL are reset in a state where the shutter is closed. Exposure is carried out during opening of the shutter, and the signals are read out in a state closing the shutter.

In the key creation mode MDK, as shown in FIG. 10B, the pixels are reset in the state where the shutter is closed, and the pixel signals are read out after a certain time. In this case, exposure is not carried out, therefore only the leak currents generated in the photodiodes PD are output as the unique key pattern. This unique key pattern, as shown in FIG. 10D, has a maximum value due to a heavy metal contaminant or the like, therefore has a high reproducibility.

Figure 11B:
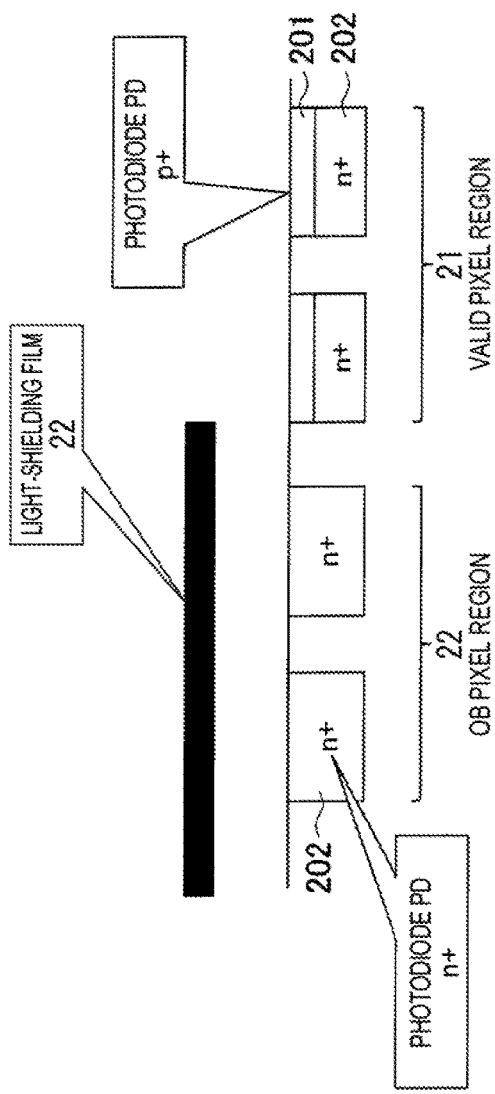
FIGS. 11A and 11B are diagrams for explaining why information of an invalid pixel region other than valid pixels in the pixel portion is employed as the fluctuation information of pixels.
Figure 11A:
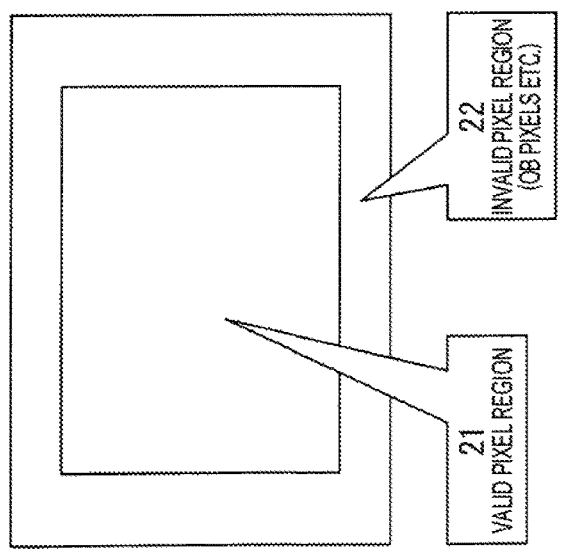

Further, the information acquisition part 81 can employ as the pixel fluctuation information PFLC the information of photodiodes in an invalid pixel region other than the valid pixels in the pixel portion 20. FIGS. 11A and 11B are diagrams for explaining why information of the invalid pixel region other than the valid pixels in the pixel portion 20 is employed as the pixel fluctuation information PFLC.

Usually, the pixel portion 20, as shown in FIG. 11A, is configured to include a valid pixel region 21 and an invalid pixel region (OB: optical black region etc.) 22 on the periphery of the valid pixel region 21. Further, the invalid pixel region (OB: optical black region) 22 is shielded from light by a light-shielding film 23 as shown in FIG. 11B. In the present embodiment, by employing information of white flaws and dark current in the pixel region other than the valid pixels such as pixels in the OB pixel region 22 and using the same as the key, it is possible to make the detection of a key difficult (a dedicated readout timing is needed for the key detection).

Further, as a photodiode (PD), a buried photodiode (BPD) has been widely used. On the surface of the substrate for forming the photodiode (PD), there are surface states due to dangling bonds and other defects, therefore many charges (dark current) are generated by heat energy, so a correct signal no longer can be read out. In a buried photodiode (BPD), the charge accumulating part of the photodiode (PD) is buried in the substrate, so entry of dark current into the signal is reduced. In a buried photodiode BPD, in the valid pixel region 21, a first conductivity type p+ layer 201 and second conductivity type n+ layer 202 are formed from the front surface side. In the present embodiment, in the OB region 22, as shown in FIG. 11B, it is also possible to remove a p-shield of the p+ layer on the surface of the photodiode PD and make it easy to generate a dark current/white flaw (=key).

Further, in the present embodiment, the leak currents of the photodiodes PD fluctuate, therefore it is also possible to consider this fluctuation and add this to the information for creation of the key. When considering the number of defects such as white flaws which are used as the key, for example, in the case of white flaws, there are later forming white flaws (white flaws which increase later) and white flaws which will disappear. As the measure for the later forming white flaws, a fixed number of white flaws are designated as the key by designation of coordinates in the chip. As the measure for the disappearing white flaws, as the white flaws, a larger number of flaws than the minimum required number of white flaws are set in advance as the key. As the measure for later forming flaws, use is made of flaws contained in a specific output range as the key.

Leak Current of Floating Diffusion FD

The information acquisition part 81 can employ as the leak current Ileak of a pixel the leak current of a floating diffusion FD.

FIGS. 12A to 12E are diagrams showing the operation waveforms etc. in the principal parts in the usual operation mode and key creation mode in a case where the leak current of a floating diffusion FD is employed as the leak current Ileak of a pixel. FIG. 12A shows a circuit diagram of the readout system of a pixel PXL, FIG. 12B shows operation waveforms at the time of the usual operation mode MDU, FIG. 12C shows operation waveforms in the key creation mode MDK, FIG. 12D shows a key pattern image by binarization of the fluctuation information, and FIG. 12E shows the relationship among the output signal, number of pixels, and threshold value VTH. In the readout system of the pixels PXL in FIG. 12A, between the vertical signal line LSGN and the power supply, a diode-connected NMOS transistor NT1 and dummy selection transistor NT2 are connected.

In the usual operation mode MDU, as shown in FIG. 12B, at the time of a shutter scan, the control lines RST and TRG are rendered the H level (ON), and the floating diffusion FD and photodiode PD are reset. At the time of a readout scan, the floating diffusion FD is reset first by the control line RST, then electrons accumulated in the photodiode PD are read out by the control line TRG.

In the key creation mode MDK, as shown in FIG. 12C, at the time of a shutter scan, the control lines RST and TRG are rendered the H level (ON), and the floating diffusion FD and photodiode PD are reset. At the time of a readout scan, the transistor NT2 is turned ON first by a signal SEL_DMY and a fixed voltage is output from a dummy pixel to the vertical signal line LSGN. Next, by reading out the selected row, the leak current accumulated in the floating diffusion FD can be read out. The floating diffusion FD has a large leak current relative to the accumulation capacity, therefore a large signal voltage can be obtained in a short time such as tens to thousands of ms. In this case, the shutter is unnecessary.

Threshold Value of Source Follower Transistor SF

The information acquisition part 81 can employ as the pixel fluctuation information the fluctuation information of the threshold value Vth of a source follower transistor SF.

FIGS. 13A to 13E are diagrams showing the operation waveforms etc. in the principal parts in the usual operation mode and key creation mode in a case where the fluctuation information of the threshold value Vth of the source follower transistor SF is employed as the pixel fluctuation information. FIG. 13A shows a circuit diagram of the readout system of a pixel PXL, FIG. 13B shows the operation waveforms at the time of a usual operation mode MDU, FIG. 13C shows operation waveforms in the key creation mode MDK, FIG. 13D shows a key pattern image by binarization of the fluctuation information, and FIG. 13E shows the relationships among the output signal, number of pixels, and threshold value VTH. In the readout system of the pixels PXL in FIG. 13A, to the vertical signal line LSGN, as a later stage circuit, a CDS circuit 44 is connected through one terminal of a switch SW0. The other terminal of the switch SW0 is connected to the supply line of the reference voltage Vref.

In the usual operation mode MDU, as shown in FIG. 13B, by using a differential signal DSrs between the reset voltage Vrst and the signal voltage Vsig as the output signal of a pixel, fluctuation of threshold values of the source follower transistors SF provided in the pixels PXL is removed.

In the key creation mode MDK, as shown in FIG. 13C, the later stage circuit CDS circuit 44 takes in the reference voltage level (Vref) at the time t1, while the later stage CDS circuit 44 takes in the reset voltage level of the pixel at the time t2. By reading out a difference between these signals, the fluctuation of reset voltages Vrst of the pixels PXL can be extracted. In the present example, this distribution of fluctuation is used as the key. The above fluctuation is about 100 mV, therefore it may be amplified by an amplifier or the like as well.

Further, in the present embodiment, for example, the information acquisition part 81 can freely designate the pixel region for acquiring the pixel fluctuation information PFLC. Further, the information acquisition part 81 can dynamically change the region to be designated as well.

Figure 14:
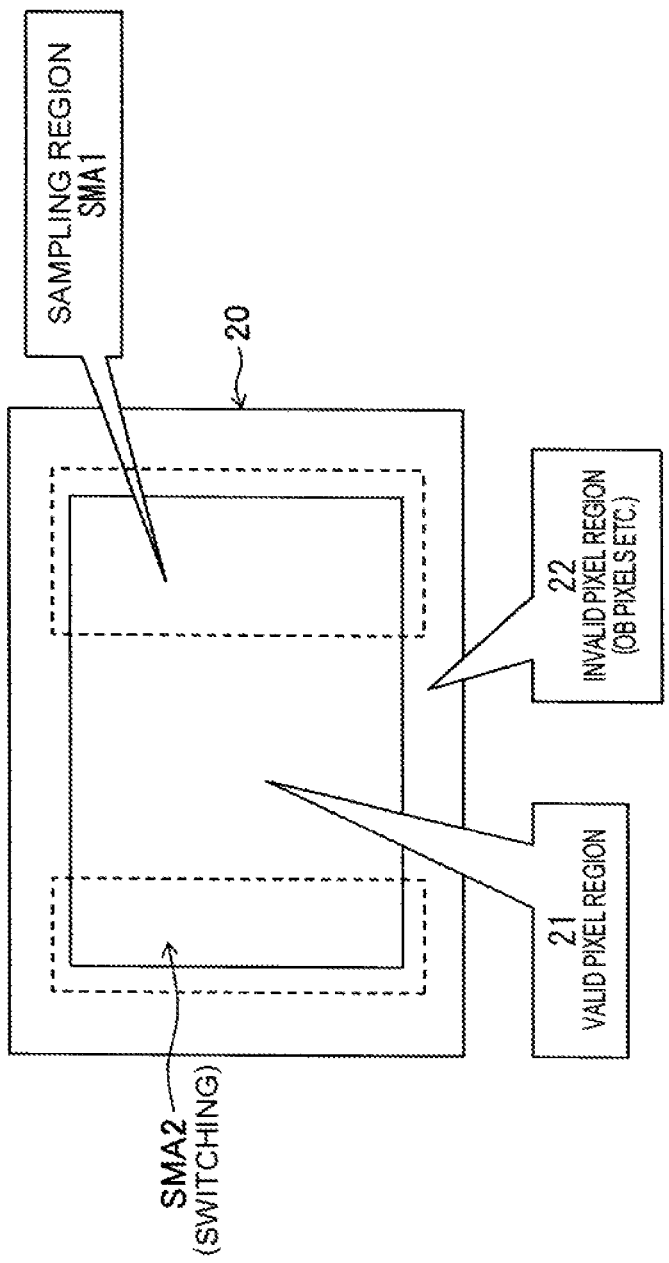
FIG. 14 is a diagram for explaining why the pixel region for acquiring the fluctuation information of pixels can be freely designated.

FIG. 14 is a diagram for explaining why the pixel region for acquiring the pixel fluctuation information PFLC can be freely designated. In the present embodiment, as shown in FIG. 14, it is possible to freely designate a sampling region SMA of white flaws or the like. If the key is generated by for example white flaws from all of the pixels PXL, it would become easy for attackers to learn the key. Therefore, as shown in FIG. 14, the region SMA for sampling white flaws/dark currents/vertical stripes, etc. is designated so that it cannot be learned from the outside. Further, by dynamically changing the region SMA for sampling (dynamically switching from the sampling region SMA1 to SMA2 in the example in FIG. 14), it becomes possible to make the key further harder to learn.

Further, in the present embodiment, for example, the vertical scanning circuit 30, readout circuit 40, and timing control circuit 60 which configure the reading part 90 can change the order of row reading for reading out the pixel signals from the pixel portion 20 at random.

Figure 15:
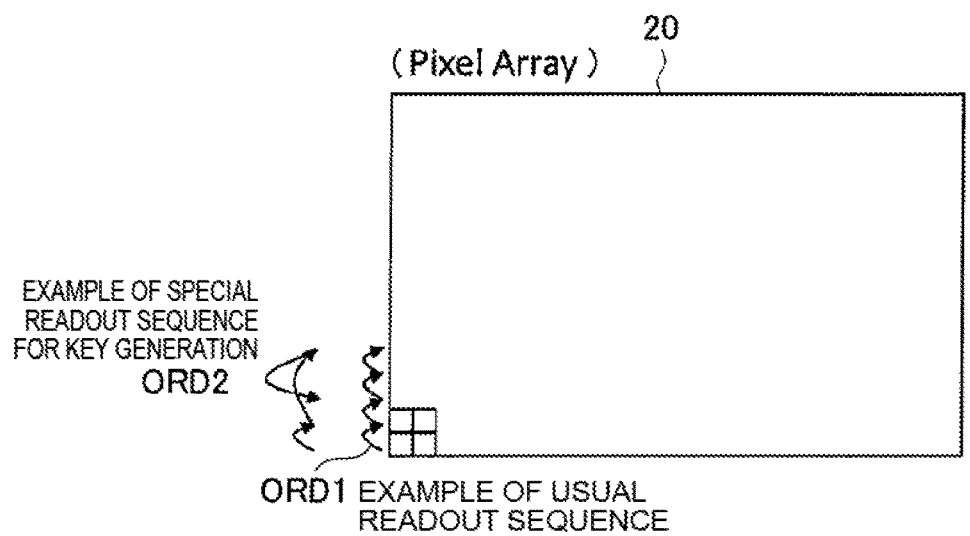
FIG. 15 is a diagram for explaining why the order of row-reading for reading the pixel signals from the pixel portion can be changed at random.

FIG. 15 is a diagram for explaining why the order of row reading for reading out the pixel signals from the pixel portion can be changed at random. As shown in FIG. 15, by changing the order of sampling to a special readout order ORD2 for key generation, which is different from the normal readout order ORD1, it becomes possible to make the key hard to learn.

Regarding Fluctuation Information CFLC of Circuits Configuring Readout Circuit 40

The fluctuation information PFLC of the pixels PXL was explained above. Next, the fluctuation information CFLC of the circuits configuring the readout circuit 40 will be explained.

Fluctuation Information of ADCs

The information acquisition part 81 can employ as the fluctuation information CFLC of the circuits configuring the readout circuit 40 the fluctuation information of the ADCs.

FIGS. 16A to 16E are diagrams showing the operation waveforms etc. in the principal parts in the usual operation mode and key creation mode in a case where the fluctuation information of the ADCs is employed as the fluctuation information CFLC of the readout circuit 40. FIG. 16A shows a circuit diagram of the readout system of a pixel PXL, FIG. 16B shows operation waveforms at the time of the usual operation mode MDU, FIG. 16C shows operation waveforms in the key creation mode MDK, FIG. 16D shows a key pattern image formed by averaging and binarization of the fluctuation information, and FIG. 16E shows the relationships among the output signal, number of columns (number of pixels), and threshold value VTH. In the readout system of a pixel PXL in FIG. 16A, to the vertical signal line LSGN, a comparator 411 and an inverter 412 which configure the ADC 41 are cascade connected. Further, a switch SW1 is connected between the input and the output of the comparator 411, a switch SW2 is connected between the non-inverted input terminal (+) and the inverted input terminal (−) of the comparator 411, and a switch SW3 is connected between the input and the output of the inverter 412.

In the usual operation mode MDU, as shown in FIG. 16B, a voltage signal PIXOUT is converted in pulse width by using a ramp wave Vramp and is digitalized in a later stage counter. An offset voltage of the comparator 411 is removed by an auto zero operation ADAZ (switch SW1 is ON) to thereby reduce the column fluctuation. By digitalizing the reset level and signal level of the comparator 411 and extracting a difference, the delay in the comparator 411 is cancelled.

In the key creation mode MDK, as shown in FIG. 16C, the pixel PXL outputs only the reset level. By AD conversion, fixed fluctuation of pixels and luminance information are removed. By changing the AZ operation to the reset operation (turning ON SW2 and turning off SW1) and outputting the offset voltage of the comparator 411, the delay of the comparator 411 is output without AD conversion of the reset level of the comparator 411.

As in the present example, by averaging in the column direction, it becomes possible to reduce the noise and raise the reproducibility of the key.

Fluctuation Information of Amplifiers

The information acquisition part 81 can employ as the fluctuation information CFLC of the circuits configuring the readout circuit 40 the fluctuation information of the amplifiers (AMP).

FIGS. 17A to 17E are diagrams showing the operation waveforms etc. in the principal parts in the usual operation mode and key creation mode in a case where the fluctuation information of amplifiers is employed as the fluctuation information CFLC of the readout circuit 40. FIG. 17A shows a circuit diagram of the readout system of a pixel PXL, FIG. 17B shows operation waveforms at the time of the usual operation mode MDU, FIG. 17C shows operation waveforms in the key creation mode MDK, FIG. 17D shows a key pattern image formed by averaging and binarization of the fluctuation information, and FIG. 17E shows the relationships among the output signal, number of pixels (number of columns), and threshold value VTH. In the readout system of a pixel PXL in FIG. 17A, to the vertical signal line LSGN, the column amplifier 421 of the amplifier 42 and the S/H circuit 43 are cascade connected. Further, a switch SW11 is connected between the input and the output of the column amplifier 421, and a switch SW12 is connected between the non-inverted input terminal (+) and the inverted input terminal (−) of the column amplifier 421. The S/H circuit 43 is configured so as to include S/H capacitors C21 and C22, switches S1, T1, S2, T2, and T1X, and an amplifier 431.

In the usual operation mode MDU, as shown in FIG. 17B, the offset voltage of the column amplifier 421 is removed by the auto zero operation (turning SW11 on), and the column fluctuation is reduced. By digitalizing the reset level and the signal level of the column amplifier 421 and extracting the difference, injection noise etc. are cancelled.

In the key creation mode MDK, as shown in FIG. 17C, the pixel PXL outputs only the reset level. Therefore, by performing CDS in the column amplifier 421, the fixed fluctuation of pixels and the luminance information are removed. By changing the AZ operation to the reset operation (turning SW12 on and turning SW11 off), outputting the offset voltage of the column amplifier 421, turning the switch T1 off, and turning the switch T1X on and using the same, the offset of the column amplifier 421 is output.

As in the present embodiment, by averaging in the column direction, it becomes possible to reduce noise and raise the reproducibility of the key.

Fluctuation Information of Sample/Hold (S/H) Circuits

The information acquisition part 81 can employ as the fluctuation information CFLC of the readout circuit 40 the fluctuation information of the S/H circuits.

FIGS. 18A to 18E are diagrams showing the operation waveforms etc. in the principal parts in the usual operation mode and key creation mode in a case where the fluctuation information of the S/H circuits is employed as the fluctuation information CFLC of the readout circuit 40. FIG. 18A shows a circuit diagram of the readout system of a pixel PXL, FIG. 18B shows operation waveforms at the time of the usual operation mode MDU, FIG. 18C shows operation waveforms in the key creation mode MDK, FIG. 18D shows a key pattern image formed by averaging and binarization of the fluctuation information, and FIG. 18E shows the relationship among the output signal, number of columns (number of pixels), and threshold value VTH. For facilitating understanding, in FIG. 18D, the same components as those in FIG. 17 will be represented by the same notations. In the readout system of a pixel PXL in FIG. 18A, to the vertical signal line LSGN, the column amplifier 421 of the amplifier 42 and the S/H circuit 43 are cascade connected. Further, the switch SW11 is connected between the input and the output of the column amplifier 421. The S/H circuit 43 is configured so as to include S/H capacitors C21 and C22, switches S1, T1, S2, T2, SW21, and SW22, and an amplifier 431.

In the usual operation mode MDU, as shown in FIG. 18B, in order to prevent an afterimage of the previous pixel data through parasitic capacitance, the capacitor by the signal SHRST is reset. After that, the reset voltage and signal voltage which are input from the pixel or the amplifier in the front stage are taken in by the switches S1 and S2 and are output by the switches T1 and T2 to the latter stage where the difference is detected.

In the key creation mode MDK, as shown in FIG. 18C, the S/H capacitors comprised of the capacitors C21 and C22 are reset by the switches T1 and T2 and switches SW21 and SW22 (turned on by SHRST). By setting the AMPAZ at a high level, off-leak currents from the switches S1 and S2 are accumulated in the capacitors C21 and C22 by fixing the output of the amplifier 421 at the reference voltage Vref. At the time of reading, the capacitor C21 is reset by the switch T1 and switch SW21 (turned on by SHRST). On the other hand, the capacitor C22 is not reset, and the accumulated off-leak voltage is output by the switch T2. From these differences, the off-leak of the switch S2 is output.

Note that, in the examples in FIGS. 12A to 12E, FIGS. 13A to 13E, FIGS. 16A to 16E, FIGS. 17A to 17E, and FIGS. 18A to 18E explained above, the threshold value VTH is set in the maximum value portion in the key data distribution pattern having the maximum value to perform the judgment processing (0/1 judgment). In this judgment method, it is possible to ensure a desired accuracy of determination. However, by employing the method as shown in FIGS. 19A to 19C, it becomes possible to further improve the accuracy of determination.

Figure 19A:
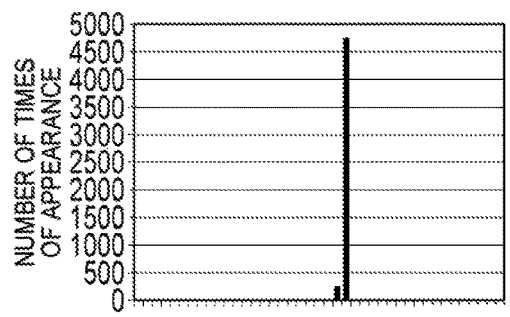
FIGS. 19A to 19C are diagrams for explaining a method of generating a key by excluding data in the vicinity of a determination threshold considering fluctuation of dispersion due to changes in the environment.
Figure 19B:
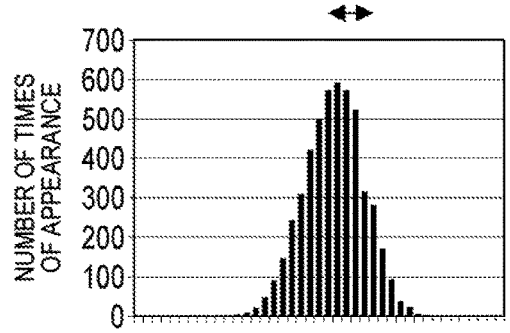
Figure 19C:
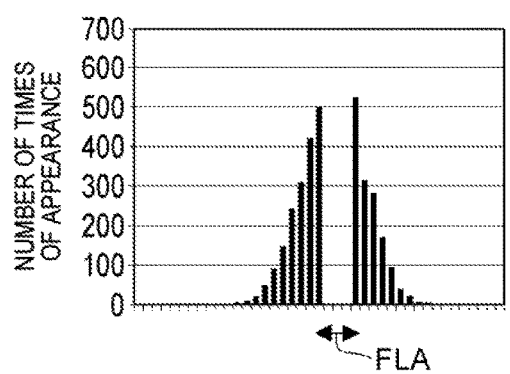

FIGS. 19A to 19C are diagrams for explaining the method of generating the key by removing the data in the vicinity of the determination threshold VTH considering fluctuation of dispersion due to changes in the environment. FIG. 19A shows an example of the distribution of data in a case where CSD processing is carried out (case where CDS exists), FIG. 19B shows an example of the distribution of data in a case where CSD processing is not carried out (case without CDS), and FIG. 19C shows an example of excluding the data in the vicinity of the determination threshold VTH.

The maximum value portion in the key data distribution pattern is influenced by temperature and other changes in the environment, therefore bit inversion is liable to occur in the 0/1 judgment processing. Therefore, in the present example, as shown in FIG. 19C, in order to prevent bit inversion with respect to changes in the environment, the key is generated by excluding the data in the vicinity of the determination threshold VTH considering the fluctuation of dispersion due to changes in the environment. In other words, the information acquisition part 81 excludes the data in a region FLA which tends to fluctuate in judgment result due to changes in the environment in the vicinity of the determination threshold VTH so as to acquire the fluctuation information for generating the key.

Output (Fluctuation) Information of SRAM of Column Memory

The information acquisition part 81 can employ as the fluctuation information CFLC of the circuits configuring the readout circuit 40 the output (fluctuation) information of an SRAM of the column memory.

Figure 21:
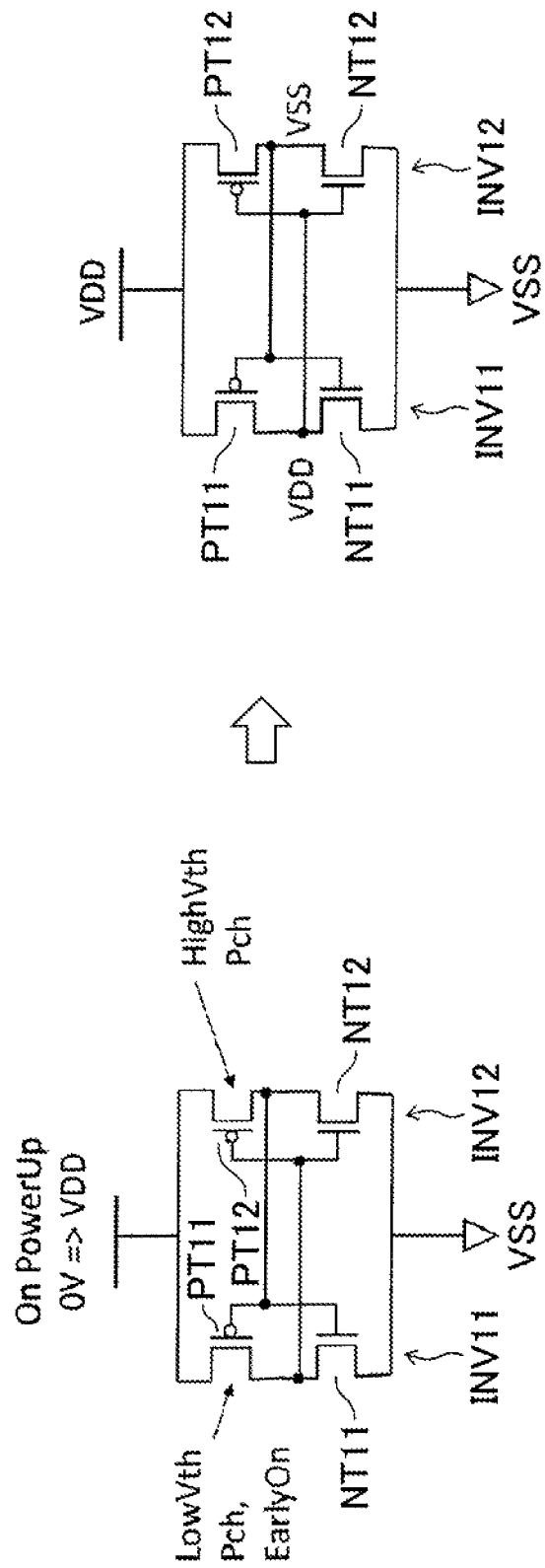

FIG. 20 is a block diagram schematically showing a solid-state imaging device having a column memory. FIG. 21 is a diagram for explaining output information of the SRAM when the power is ON.

Usually, the solid-state imaging device 10A comprised of the CMOS image sensor has a column memory 45 which is configured by a SRAM as the readout circuit 40. In the SRAM of the column memory 45, for example, data by ADC is held and is transmitted to the data path 46.

The SRAM, as shown in FIG. 21, is configured by cross-coupling between the input/output and the output/input of an inverter INV11 configured by a PMOS transistor PT11 and NMOS transistor NT11 and an inverter INV12 configured by a PMOS transistor PT12 and NMOS transistor NT12. Then, in the SRAM shown in FIG. 21, the threshold value VTP11 of the PMOS transistor PT11 is set lower than the threshold value VTP12 of the PMOS transistor PT12. In this configuration, when the power is ON, the PMOS transistor PT11 turns on earlier than the PMOS transistor PT12.

In this way, an initial value of the SRAM when the power is ON is determined according to a balance of the threshold values among the transistors. The initial value of this SRAM can be employed as the fluctuation information CFLC of the circuits configuring the readout circuit 40 for generating the key.

Configuration of Key Generation Part 82

The key generation part 82 (FIG. 4) generates the unique key by using at least one of the pixel fluctuation information which is acquired and supplied by the information acquisition part 81 and the fluctuation information of the readout circuit 40. The key generation part 82 supplies the generated unique key KY to the discrimination data generation part 84. The key generation part 82 generates the unique key KY in for example a period other than the time of reading out the valid pixels in the pixel portion 20 (for example a blanking period).

The key generation part 82 generates the key by a fuzzy extractor in order to make the reproducibility of the key stronger. A fuzzy extractor is a processor aimed at issuance of the same output with respect to input stabilized to a certain extent.

Figure 22A:
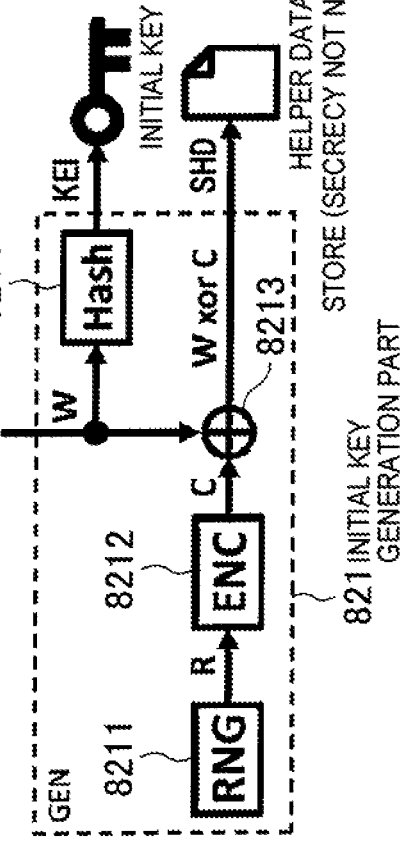
FIGS. 22A and 22B are diagrams showing an example of the configuration of a fuzzy extractor which can be applied to the key generation part according to the present embodiment.
Figure 22B:
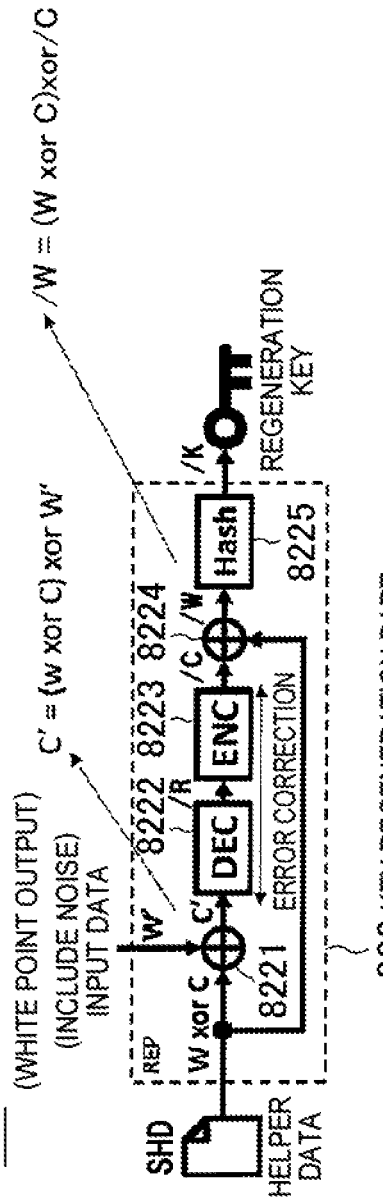

FIGS. 22A and 22B are diagrams showing an example of the configuration of a fuzzy extractor which can be applied to the key generation part according to the present embodiment. A fuzzy extractor 820 in FIG. 22 has an initial key generation part 821 shown in FIG. 22A and a key regeneration part 822 shown in FIG. 22B.

The initial key generation part 821, as shown in FIG. 22A, is configured to include a ring oscillator (RNG) 8211, encryption part (ENC) 8212, exclusive OR circuit (XOR) 8213, and Hash part 8214.

In the initial key generation part 821, the fluctuation information of pixels related to for example white flaw output which was acquired by the information acquisition part 81 is input as the input data W to the XOR 8213 and Hash part 8214. In the Hash part 8214, the initial key KYI is generated based on the input data W. This initial key KYI is supplied to the discrimination data generation part 84. This initial key KYI is for example written into the memory 86 as the key data at the time of shipping. For example, at the time of shipping of a chip, it is also possible to compose the initial key data so that it is written into a memory such as an electron fuse (efuse) which can be cut by software so that the reproducibility of the key data is guaranteed.

Further, in the initial key generation part 821, an oscillation output signal R of the ring oscillator 8211 is encrypted by the encryption part 821, and that encrypted data C is supplied to the XOR 8213. In the XOR 8213, the exclusive OR between the input data W and the encrypted data C is taken. Due to this, helper data SHD (WxorC) is generated. This helper data SHD (WxorC) is not necessarily secret unlike the key data and is stored in the memory 86. The helper data SHD stored in the memory 86 is used as the base data of regeneration of the key in the key regeneration part 822.

The key regeneration part 822, as shown in FIG. 22B, is configured to include an exclusive OR circuit (XOR) 8221, decoding part (DEC) 8222, encryption part (ENC) 8223, exclusive OR circuit (XOR) 8224, and Hash part 8225. Note that, the decoding part (DEC) 8222 and encryption part (ENC) 8223 function as the error correction part.

In the key regeneration part 822, the input data W' including pixel fluctuation information related to for example white flaw output which is acquired by the information acquisition part 81 and the helper data SHD (WxorC) stored in the memory 86 are input to the XOR 8221. The helper data SHD (WxorC) is input to the XOR 8224 as well. In the XOR 8221, an exclusive OR between the input data W' and the helper data WxorC is taken, then the result is supplied as the data C' to the decoding part 8222. In the decoding part 8222, the decoding processing for the data C' is carried out to generate the decoding data/R, then the decoding data/R is supplied to the encryption part 8223. The decoding data/R is encrypted by the encryption part 8212, then that encrypted data /C{=(WxorC)xorW'} is supplied to the XOR 8224. In the XOR 8224, an exclusive OR between the encrypted data /C and the helper data WxorC is taken, then the result is input as the data /W{=(WxorC)xor/C} to the Hash part 8225. Then, in the Hash part 8225, based on the input data /W{=(WxorC)xor/C}, the regeneration key KY is generated. This regeneration key KY is supplied to the discrimination data generation part 84. If the noise in the input data W' is small and the data C' can be corrected, /C becomes equal to C and /W becomes equal to W, therefore the key is regenerated.

Note that, the above key generation part 82 was explained with reference to the example in which the unique key is generated based on the fluctuation information of pixels or the readout circuit 40. However, it is also possible to configure this part so as to perform operations between unique keys generated according to different fluctuation information to obtain a final unique key. For example, the following configuration is also possible.

That is, it is also possible to configure the key generation part 82 so as to include for example a first function of using the fluctuation information of the ADCs 41, amplifiers 42, or S/H circuits 43 in the readout circuit 40 to generate the first unique key and a second function of using the output of the SRAM of the column memory 45 in the readout circuit 40 to generate the second unique key and processing the first unique key generated by the first function and the second unique key generated by the second function to thereby generate the final unique key.

This configuration can be applied in the same way even for the fluctuation information of a pixel.

The image data generation part 83 uses predetermined signal processing with respect to a readout signal which is read out through the readout circuit 40 in the usual readout mode and is subjected to predetermined processing so as to generate for example the two-dimensional image data IMG as shown in FIG. 5. The image data generation part 83 supplies the generated image data IMG to the combining part 85.

The image data generation part 83 supplies the acquisition data AQD acquired from the solid-state imaging device 10 to the discrimination data generation part 84. Here, the acquisition data AQD is at least one data among the data concerning the pixels, date, temperature, and GPS (global positioning system).

The discrimination data generation part 84 combines the unique key KY generated in the key generation part 82 with the acquisition data AQD acquired in the present solid-state imaging device 10 to generate the discrimination data DSCD. The discrimination data generation part 84 supplies the generated discrimination data DSCD to the combining part 85.

The combining part 85, as shown in FIG. 5, combines the discrimination data DSCD generated in the discrimination data generation part 84 and the image data IMG based on the readout data of the image data generation part 83 and outputs the result as the final output of the sensor chip. The combining part 85, for example, as shown in FIG. 5, performs combination so that the combined data has the sequence of a header HD, discrimination data DSCD, and image data IMG.

As explained above, in the encryption processing system 80, the unique key KY is generated from fluctuation information unique to the solid-state imaging device 10 (fluctuation information of pixel and readout circuit), the unique key KY and the acquisition data AQD obtained from the solid-state imaging device 10 are combined to generate the discrimination data DSCD, and this discrimination data DSCD is combined with the image data IMG for output. Therefore, unless information concerning the unique key is known, correct discrimination data cannot be created, and alteration is understood if the image is altered or the like, so falsification becomes difficult.

Note that, the combining part 85 may also be configured so as to include a function of hierarchically masking the image portion by using the combined key information. Further, the combining part 85 may also be configured so as to include a function of electronically watermarking the image by using the combined key information.

In the solid-state imaging device 10 having the above configuration, the operation at the time of the key creation mode of the encryption processing system 80 is roughly carried out as follows. Here, as an example, an operation in a case where the leak current of a photodiode PD is employed as the leak current Ileak of a pixel explained related to FIG. 10 will be explained.

In the key creation mode MDK, as shown in FIG. 10B, the pixels are reset in a state where the shutter is closed, and the pixel signals are read out after a certain time. In this case, exposure is not carried out, therefore only the leak currents generated in the photodiodes PD are output as the unique key pattern.

This unique information is acquired as the fluctuation information PFLC in the information acquisition part 81 and is supplied to the key generation part 82. In the key generation part 82, the unique key KY is generated by using the fluctuation information of pixels which is acquired by the information acquisition part 81 and supplied. In the key generation part 82, the generated unique key KY is supplied to the discrimination data generation part 84. In the key generation part 82, for example, the unique key KY is generated in a period other than the time of reading out of the valid pixels in the pixel portion 20.

In the discrimination data generation part 84, the discrimination data DSCD is generated by combining the unique key KY generated in the key generation part 82 and the acquisition data AQD acquired in the solid-state imaging device 10. In the discrimination data generation part 84, the generated discrimination data DSCD is supplied to the combining part 85.

In the combining part 85, the discrimination data DSCD generated in the discrimination data generation part 84 and the image data IMG based on the readout data by the image data generation part 83 are combined and the result is output as the final output of the sensor chip.

As explained above, in the present embodiment, the signal processing circuit 70 generates two-dimensional image data by predetermined signal processing with respect to the readout signals which are read out by the readout circuit 40 and are subjected to predetermined processing. However, in the present embodiment, in order to prevent unauthorized use, alteration, falsification, etc. of the image, the encryption processing system 80 is configured so as to generate the unique key KY from fluctuation information unique to the solid-state imaging device 10 (fluctuation information of pixels and readout circuit), combine the unique key KY and the acquisition data AQD obtained from the solid-state imaging device 10 to generate the discrimination data DSCD, combine this discrimination data DSCD with the image data IMG, and output the result so that the discrimination data cannot be correctly created unless the information concerning the unique key KY is known. Due to this, the solid-state imaging device 10 in the present embodiment can ensure the tamper resistance (difficulty of analysis) of the unique key and consequently becomes able to prevent alteration and falsification of images.

Note that, in the present embodiment, a configuration where the components in the solid-state imaging device 10 are mounted in the same package can be employed.

It is possible to employ a configuration in which, in an SiP (silicon in package) package sealing the solid-state imaging device (CIS) 10 and ISP (image signal processor) in the same package, the signal processing for generating the key and the discrimination data is completed inside the package, so the discrimination data can be generated without outputting the unique key data to the outside of the package.

Further, in an SoC (system on chip) package provided with an image sensor and signal processing circuit, it is possible to employ a configuration in which the signal processing for generating the key and the discrimination data is completed inside the chip, so the discrimination data can be generated without outputting the unique key data to the outside of the chip.

Further, the solid-state imaging device 10 in the present embodiment, as explained above, can be configured so as to have a drive timing for accumulating leak current etc. for a long period of time separately from the usual read drive timing. Further, the full-scale voltage of the analog amplifier, digital amplifier, or ADC may be reduced, and the accumulated voltage of the leak voltage may be emphasized and output as well. Further, by averaging or adding data in a plurality of rows or a plurality of frames, a random noise component may be reduced as well.

Modifications of the present invention will be explained below.

Modification 1

FIG. 23 is a diagram for explaining a modification of the encryption processing system in the solid-state imaging device according to the embodiment of the present invention.

With respect to the encryption processing system 80 described above, as shown in FIG. 23, by using a public key PBKY, it becomes possible to impart an evidentiary capability by the key so that, for example, browsing of a photo or other image data is made possible, but editing is made impossible.

From the unique key KY generated in the encryption processing system in a solid-state imaging device (CMOS image sensor) 10B in the present embodiment, a private key PRKY and public key PBKY are created. The private key PRKY is stored in an access-restricted memory or the like so that no one can learn it. The public key PBKY is registered in a public key server or the like so that any one can download it.

The private key PRKY and the public key PBKY have the following relationship. The private key PRKY and the public key PBKY are related to each other. However, no matter how much the public key PBKY is investigated, it cannot be learned what the private key PRKY is. Further, a document etc. encrypted by the private key PRKY cannot be restored to its original form unless the paired public key PBKY is used. Conversely, encryption can be carried out by the public key PBKY, but the document etc. cannot be restored to its original form unless the private key PRKY is used.

If linked with the configuration in FIG. 23, image-related data, including photo etc., protected by the private key PRKY can be browsed, but cannot be edited. For example, in this case, the photographing camera can be verified, so may have an evidentiary capability. Further, the data can be unlocked by the public key PBKY, can be browsed, and becomes editable. However, it cannot be restored to its original state. In this case, it may not have an evidentiary capability.

Modification 2

FIG. 24 is a diagram for explaining another modification of the encryption processing system in the solid-state imaging device according to the embodiment of the present invention.

In this modification, as shown in FIG. 24, a method of inserting discrimination image DSIM like a watermark in a moving image is proposed.

In this example, the discrimination image DSIM is inserted into a usual image MVPC of the moving image at every fixed interval. CDS processing is carried out with respect to the usual image MVPC, but CDS processing is not carried out with respect to the discrimination image DSIM acting as watermark.

In this example, the operation is performed in the usual operation mode MDU of any of FIGS. 16A to 16E, FIGS. 17A to 17E, or FIGS. 18A to 18E, and the reset level is not subtracted. The discrimination is verification that the fluctuation is unique to the individual image by the difference from the images before and after this image.

According to this modification, a processing load such as key generation is not generated.

The solid-state imaging device 10 explained above can be applied as the imaging device to a digital camera, video camera, portable terminal, or monitoring camera, medical endoscope, or other electronic apparatus.

Figure 25:
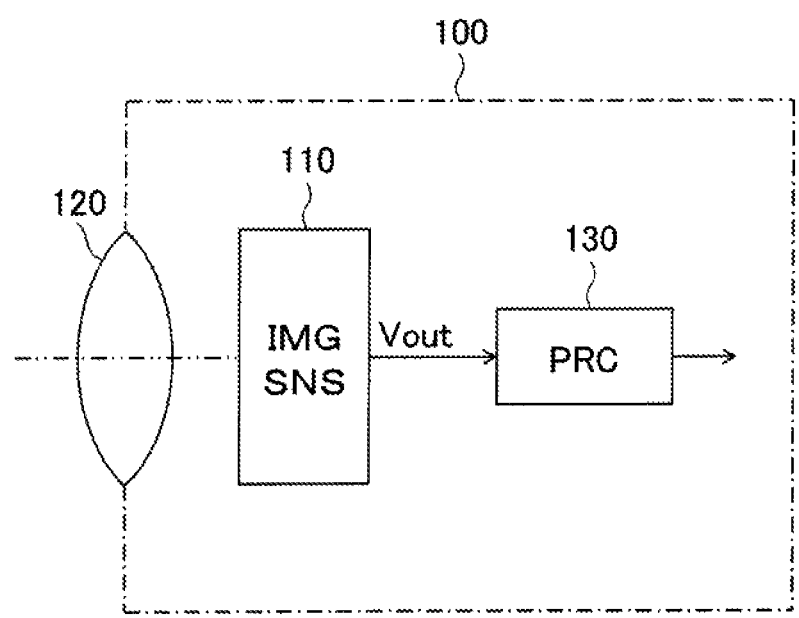
FIG. 25 is a diagram showing an example of the configuration of an electronic apparatus to which the solid-state imaging device according to the embodiment of the present invention is applied.

FIG. 25 is a diagram showing an example of the configuration of an electronic apparatus mounting a camera system to which the solid-state imaging device according to an embodiment of the present invention is applied.

The present electronic apparatus 100, as shown in FIG. 25, has a CMOS image sensor (IMGSNS) 110 to which the solid-state imaging device 10 according to the present embodiment can be applied. Further, the electronic apparatus 100 has an optical system (lens etc.) 120 guiding an incident light (forming a subject image) to the pixel region in this CMOS image sensor 110. The electronic apparatus 100 has a signal processing circuit (PRC) 130 for processing the output signal of the CMOS image sensor 110.

The signal processing circuit 130 applies predetermined signal processing to the output signal of the CMOS image sensor 110. The image signal processed in the signal processing circuit 130 can be projected as a moving image in a monitor configured by a liquid crystal display or the like or can be output to a printer. Further, it can be directly recorded in a memory card or other recording medium. Various forms are possible.

As explained above, by mounting the solid-state imaging device 10 explained before as the CMOS image sensor 110, it becomes possible to provide a high performance, small-size, and low cost camera system. Further, electronic apparatuses used for applications with restrictions due to the requirements of installation of cameras such as mounting size, number of connectable cables, cable lengths, and installation heights such as monitoring cameras, cameras for medical endoscopes, etc. can be realized.

The invention claimed is:

1. A solid-state imaging device, comprising:
a pixel portion in which a plurality of pixels including photodiodes are arranged in rows and columns;
a reading circuit reading pixel signals from the pixel portion; and
a key generation circuit which generates a unique key by using at least one of pixel fluctuation information or reading circuit fluctuation information,
wherein the key generation circuit
generates the unique key by using the pixel fluctuation information and
uses a leak current and position information as the pixel fluctuation information.

2. The solid-state imaging device according to claim 1, wherein the key generation circuit generates the unique key by using the position information of a pixel showing a certain level or more of the leak current.

3. The solid-state imaging device according to claim 2, wherein the key generation circuit generates the unique key by using a set of the higher significant pixels in an order of leak current as the information.

4. The solid-state imaging device according to claim 3, wherein the key generation circuit generates the unique key by using column direction and row direction addresses in the set.

5. The solid-state imaging device according to claim 1, wherein the key generation circuit uses a leak current of a photodiode as the leak current of the pixel.

6. The solid-state imaging device according to claim 5, wherein the key generation circuit generates the unique key by using information of an invalid pixel region other than valid pixels in the pixel portion.

7. The solid-state imaging device according to claim 6, wherein, in the invalid pixel region, a first conductivity type shield on the photodiode surface is removed.

8. The solid-state imaging device according to claim 5, wherein the leak current of the photodiode fluctuates.

9. The solid-state imaging device according to claim 1, wherein:
the pixel includes a floating diffusion to which a charge accumulated in the photodiode is transferred, and
the key generation circuit uses the leak current of the floating diffusion as the leak current of the pixel.

10. The solid-state imaging device according to claim 1, wherein:
the pixel includes a source follower transistor which outputs a pixel signal in accordance with the potential of the floating diffusion to which the charge accumulated in the photodiode is transferred, and
the key generation circuit uses fluctuation of a threshold value of the source follower transistor as the pixel fluctuation information.

11. A solid-state imaging device comprising:
a pixel portion in which a plurality of pixels including photodiodes are arranged in rows and columns;
a reading circuit reading pixel signals from the pixel portion;
a key generation circuit which generates a unique key by using at least one of pixel fluctuation information or reading circuit fluctuation information; and
an information acquisition circuit for acquiring the pixel fluctuation information,
wherein the information acquisition circuit acquires the fluctuation information of the pixel linked with a threshold value.

12. The solid-state imaging device according to claim 11, wherein the information acquisition circuit excludes data in a region having a tendency of fluctuation in the judgment result according to a change in the environment in the vicinity of the determination threshold so as to acquire the fluctuation information for generating the key.

13. The solid-state imaging device according to claim 11, wherein the information acquisition circuit has a plurality of threshold values set therein and discriminates the information in connection with the plurality of threshold values.

14. The solid-state imaging device according to claim 11, wherein the threshold value is changed according to the environment.

15. The solid-state imaging device according to claim 11, wherein the information acquisition circuit can freely designate the pixel region for acquiring the pixel fluctuation information.

16. The solid-state imaging device according to claim 15, wherein the information acquisition circuit can dynamically change the pixel region to be designated.

17. The solid-state imaging device according to claim 11, wherein the reading circuit can change a sequence of row-reading for reading out the pixel signals from the pixel portion at random.

18. The solid-state imaging device according to claim 11, wherein:
the reading circuit has analog-to-digital converters (ADC) which convert the pixel signals output from the columns in the pixel portion from analog signals to digital signals, and
the key generation circuit generates the unique key by using the fluctuation information of the ADCs in the reading circuit.

19. The solid-state imaging device according to claim 11, wherein:
the reading circuit has amplifiers which amplify the pixel signals output from the columns in the pixel portion, and
the key generation circuit generates the unique key by using at least one of the fluctuation information of the pixel linked with the threshold value or the fluctuation information of the amplifiers in the reading circuit.

20. The solid-state imaging device according to claim 11, wherein:
the reading circuit has sample/hold (S/H) circuits for sampling/holding the pixel signals output from the columns in the pixel portion, and
the key generation circuit generates the unique key by using at least one of the fluctuation information of the pixel linked with the threshold value or the fluctuation information of the S/H circuits in the reading circuit.

21. The solid-state imaging device according to claim 11, wherein:
the reading circuit has an SRAM as a column memory for storing the signals obtained by applying predetermined processing to the pixel signals output from the columns in the pixel portion, and
the key generation circuit generates the unique key by using at least one of the fluctuation information of the pixel linked with the threshold value or the output of the SRAM of the column memory in the reading circuit.

22. The solid-state imaging device according to claim 11, wherein the key generation circuit
includes a first function of using the pixel fluctuation information and a second function of using the reading circuit fluctuation information and
generates the unique key by performing processing on the unique key generated according to the first function and the unique key generated according to the second function.

23. The solid-state imaging device according to claim 11, wherein the key generation circuit generates the key by a fuzzy extractor.

24. The solid-state imaging device according to claim 23, wherein the key generation circuit generates the unique key by using at least one of helper data obtained by generating the key in an initial stage or the pixel fluctuation information or the reading circuit fluctuation information.

25. The solid-state imaging device according to claim 11, further comprising a discrimination data generation circuit which combines the unique key generated in the key generation circuit and the acquisition data acquired in the solid-state imaging device to generate discrimination data.

26. The solid-state imaging device according to claim 25, wherein the acquisition data is at least one data among data such as the pixels, date, temperature, and data concerning the GPS.

27. The solid-state imaging device according to claim 25, further comprising a combining circuit which combines the discrimination data generated in the discrimination data generation circuit and the image data based on the readout data of the reading circuit and outputs the result.

28. The solid-state imaging device according to claim 27, wherein the discrimination data generation circuit cannot create correct discrimination data unless information concerning the unique key is known.

29. The solid-state imaging device according to claim 28, wherein:
a private key and public key corresponding to the unique key generated by the key generation circuit are created, and
the image data encrypted by the private key
can be browsed, but cannot be edited, but
can be browsed and can be edited, but cannot be restored to its original form by unlocking by the public key.

30. The solid-state imaging device according to claim 27, wherein the combining circuit includes a function of hierarchically masking the image portion by using the combined key information.

31. The solid-state imaging device according to claim 27, wherein the combining circuit includes a function of inserting an electronic watermark into the image by using the combined key information.

32. The solid-state imaging device according to claim 11, wherein the components in the solid-state imaging device are mounted in the same package.

33. The solid-state imaging device according to claim 11, wherein key data before shipping of the chip is written in the memory.

34. The solid-state imaging device according to claim 11, wherein the key generation circuit generates the unique key in a period other than the time of reading out the valid pixels in the pixel portion.

35. A method for driving a solid-state imaging device including
a pixel portion in which a plurality of pixels including photodiodes are arranged in rows and columns and
a reading circuit reading pixel signals from the pixel portion, comprising
an information acquisition step of acquiring at least one information of pixel fluctuation information or reading circuit fluctuation information and
a key generation step of generating a unique key by using the fluctuation information acquired in the information acquisition step,
wherein the information acquisition step acquires the fluctuation information of the pixel linked with a threshold value.

36. The method for driving the solid-state imaging device according to claim 35, wherein, in the key generation step, the unique key is generated in a period other than the time of reading out the valid pixels in the pixel portion.

37. An electronic apparatus comprising:
a solid-state imaging device; and
an optical system of forming a subject image in the solid-state imaging device, wherein the solid-state imaging device includes
a pixel portion in which a plurality of pixels including photodiodes are arranged in rows and columns,
a reading circuit reading pixel signals from the pixel portion,
a key generation circuit for generating a unique key by using at least one of pixel fluctuation information or reading circuit fluctuation information, and
an information acquisition circuit for acquiring the pixel fluctuation information,
wherein the information acquisition circuit acquires the fluctuation information of the pixel linked with a threshold value.

* * * * *